United States Patent
Shu et al.

(10) Patent No.: US 12,144,212 B2
(45) Date of Patent: Nov. 12, 2024

(54) DISPLAY SUBSTRATE WITH DISPLAY REGION INCLUDING OPENING AND MANUFACTURING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Xiaoqing Shu, Beijing (CN); Mengmeng Du, Beijing (CN); Xiangdan Dong, Beijing (CN); Rong Wang, Beijing (CN)

(73) Assignees: Chengdu BOE Optoelectronics Technology Co., Ltd., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 737 days.

(21) Appl. No.: 17/279,861

(22) PCT Filed: May 13, 2020

(86) PCT No.: PCT/CN2020/090031
§ 371 (c)(1),
(2) Date: Mar. 25, 2021

(87) PCT Pub. No.: WO2021/226879
PCT Pub. Date: Nov. 18, 2021

(65) Prior Publication Data
US 2022/0115487 A1    Apr. 14, 2022

(51) Int. Cl.
*H10K 59/131*    (2023.01)
*G09G 3/3208*    (2016.01)
(Continued)

(52) U.S. Cl.
CPC ......... *H10K 59/131* (2023.02); *G09G 3/3208* (2013.01); *H10K 59/1213* (2023.02);
(Continued)

(58) Field of Classification Search
CPC ............. H10K 59/131; H10K 59/1213; H10K 59/1216; H10K 59/1201; G09G 3/3208; G09G 3/3233; G09G 2300/0426
See application file for complete search history.

(56) References Cited

U.S. PATENT DOCUMENTS 10,460,656 B2   10/2019  Xi et al.
10,916,736 B2 *  2/2021  Kwon ................. H01L 27/1225
(Continued)

FOREIGN PATENT DOCUMENTS

CN   107633807 A   1/2018
CN   108598127 A   9/2018
(Continued)

OTHER PUBLICATIONS

International Search Report of PCT/CN2020/090031 in Chinese, mailed Jan. 26, 2021.
(Continued)

*Primary Examiner* — Afroza Chowdhury
(74) *Attorney, Agent, or Firm* — Collard & Roe, P.C.

(57) ABSTRACT

A display substrate and a manufacturing method thereof, and a display device are provided. The display substrate includes a display region and a peripheral region. The display region includes an opening, and the peripheral region includes an opening peripheral region at least partially in the opening; the first conductive pattern is configured to transmit an electrical signal for the display region and includes first wire groups arranged side by side in a first direction, and each first wire group includes at least two first wires arranged side by side in the first direction; in a direction perpendicular to
(Continued)

the base substrate, the first wire is insulated from the semiconductor pattern and the second conductive pattern, respectively; and the semiconductor pattern is electrically connected to the second conductive pattern through via holes in the opening peripheral region, and the via holes are between adjacent first wire groups in the first direction.

20 Claims, 10 Drawing Sheets

(51) Int. Cl.
*H10K 59/121* (2023.01)
*G09G 3/3233* (2016.01)
*H10K 59/12* (2023.01)

(52) U.S. Cl.
CPC ....... *H10K 59/1216* (2023.02); *G09G 3/3233* (2013.01); *G09G 2300/0426* (2013.01); *H10K 59/1201* (2023.02)

(56) References Cited

U.S. PATENT DOCUMENTS

2018/0190190 A1\* 7/2018 Xi .................. G09G 3/3208
2019/0157630 A1\* 5/2019 Kwon ............... G09G 3/3233
2022/0399422 A1\* 12/2022 Zhang ................ H10K 71/00

FOREIGN PATENT DOCUMENTS

| CN | 109493788 A | 3/2019 |
| CN | 209560243 U | 10/2019 |
| CN | 209843713 U | 12/2019 |
| KR | 1020090005651 A | 1/2009 |

OTHER PUBLICATIONS

Notice of Transmittal of the International Search Report of PCT/CN2020/090031 in Chinese, mailed Jan. 26, 2021.
Written Opinion of the International Searching Authority of PCT/CN2020/090031 in Chinese, mailed Jan. 26, 2021.
International Search Report of PCT/CN2020/090031 mailed Jan. 26, 2021 in English.

\* cited by examiner

DISPLAY SUBSTRATE WITH DISPLAY REGION INCLUDING OPENING AND MANUFACTURING METHOD THEREOF, AND DISPLAY DEVICE

CROSS REFERENCE TO RELATED APPLICATIONS

This application is the National Stage of PCT/CN2020/090031 filed on May 13, 2020, the disclosure of which is incorporated by reference.

TECHNICAL FIELD

Embodiments of the present disclosure relate to a display substrate and a manufacturing method thereof, and a display device.

BACKGROUND

Organic light-emitting diode (OLED) display devices have advantages of the thin thickness, light weight, wide viewing angle, active light emission, continuously adjustable luminous color, low cost, fast response speed, low energy consumption, low driving voltage, wide working temperature range, simple production process, high luminous efficiency, flexible display, etc. Therefore, OLED display devices have been more and more widely used in display fields such as a mobile phone, a tablet computer, a digital camera, etc.

SUMMARY

At least one embodiment of the present disclosure provides a display substrate, and the display substrate comprises a display region and a peripheral region surrounding the display region; the display region comprises an opening, and the peripheral region comprises an opening peripheral region at least partially in the opening; the display substrate comprises a base substrate, a semiconductor pattern, a first conductive pattern, and a second conductive pattern, the semiconductor pattern, the first conductive pattern, and the second conductive pattern being in the opening peripheral region; the semiconductor pattern is on the base substrate, the first conductive pattern is on a side of the semiconductor pattern away from the base substrate, and the second conductive pattern is on a side of the first conductive pattern away from the semiconductor pattern; the first conductive pattern is configured to transmit an electrical signal for the display region; the first conductive pattern comprises a plurality of first wire groups arranged side by side in a first direction, and each of the first wire groups comprises at least two first wires arranged side by side in the first direction; in a direction perpendicular to the base substrate, each of the at least two first wires is spaced and insulated from the semiconductor pattern and the second conductive pattern, respectively, so as to be able to form a capacitor; and the semiconductor pattern is electrically connected to the second conductive pattern through a plurality of via holes in the opening peripheral region, and the plurality of via holes are between adjacent first wire groups in the first direction.

For example, in the display substrate provided by at least one embodiment of the present disclosure, among the plurality of first wire groups, regions, where via holes are arranged in a substantially identical manner, are between adjacent first wire groups in the first direction.

For example, in the display substrate provided by at least one embodiment of the present disclosure, a distance between adjacent first wire groups in the first direction is greater than a distance between adjacent first wires in the each of the first wire groups in the first direction.

For example, in the display substrate provided by at least one embodiment of the present disclosure, among the plurality of first wire groups, the distance between adjacent first wire groups in the first direction is approximately identical.

For example, in the display substrate provided by at least one embodiment of the present disclosure, among the plurality of first wire groups, the at least two first wires in the each of the first wire groups are arranged in an identical manner in the first direction.

For example, in the display substrate provided by at least one embodiment of the present disclosure, in the each of the first wire groups, the distance between adjacent first wires in the first direction is approximately identical.

For example, in the display substrate provided by at least one embodiment of the present disclosure, via holes on both sides of one first wire group in the first direction are arranged in a substantially symmetrical manner with respect to the one first wire group along an extending direction of the first wires.

For example, in the display substrate provided by at least one embodiment of the present disclosure, at least one row of via holes arranged in an extending direction of the first wires is provided between adjacent first wire groups in the first direction.

For example, in the display substrate provided by at least one embodiment of the present disclosure, the semiconductor pattern comprises a plurality of conductive blocks arranged side by side in a second direction, and the plurality of conductive blocks are electrically connected to the second conductive pattern through the plurality of via holes, respectively, the second direction being different from the first direction.

For example, in the display substrate provided by at least one embodiment of the present disclosure, widths of the plurality of conductive blocks in the second direction are approximately identical, and a distance between adjacent conductive blocks in the second direction is approximately identical.

For example, in the display substrate provided by at least one embodiment of the present disclosure, the second conductive pattern is continuously provided in the opening peripheral region.

For example, the display substrate provided by at least one embodiment of the present disclosure further comprises a first insulating layer and a second insulating layer; the first insulating layer and the second insulating layer are at least in the opening peripheral region; the first insulating layer is on a side of the semiconductor pattern away from the base substrate, the first conductive pattern is on a side of the first insulating layer away from the semiconductor pattern, the second insulating layer is on a side of the first conductive pattern away from the first insulating layer, and the second conductive pattern is on a side of the second insulating layer away from the first conductive pattern; and the plurality of via holes are at least in the first insulating layer and the second insulating layer and penetrate at least the first insulating layer and the second insulating layer.

For example, in the display substrate provided by at least one embodiment of the present disclosure, the display region comprises a first display region and a second display region, which are on opposite sides of the opening, the first display region, the opening, and the second display region are sequentially arranged in an extending direction of the first wires, and the first wires sequentially extend through the first display region, the opening peripheral region, and the second display region, so as to transmit an electrical signal for the first display region and the second display region.

For example, in the display substrate provided by at least one embodiment of the present disclosure, the display region further comprises a third display region; the third display region is connected to one of two opposite edges of the first display region in the first direction, and is connected to one of two opposite edges of the second display region in the first direction; the display substrate comprises a plurality of third wires in the third display region, an extending direction of the plurality of third wires is identical to the extending direction of the first wires, and the plurality of third wires are configured to transmit an electrical signal for the third display region; and the plurality of third wires and the first conductive pattern are in an identical layer.

For example, the display substrate provided by at least one embodiment of the present disclosure further comprises a power wire pattern; the power wire pattern and the second conductive pattern are in an identical layer, or the power wire pattern is on a side of the second conductive pattern away from the base substrate; and the power wire pattern is electrically connected to the second conductive pattern to provide an electrical signal.

For example, in the display substrate provided by at least one embodiment of the present disclosure, the power wire pattern is in the display region, the power wire pattern and the second conductive pattern are in the identical layer, and the power wire pattern is configured to provide a high voltage signal.

For example, the display substrate provided by at least one embodiment of the present disclosure further comprises a plurality of pixel units in the display region; each of the pixel units comprises a pixel driving circuit on the base substrate, and the pixel driving circuit comprises a thin film transistor and a storage capacitor; the thin film transistor comprises a gate electrode, an active layer, a source electrode, and a drain electrode, and the storage capacitor comprises a first capacitor electrode and a second capacitor electrode opposite to the first capacitor electrode; and the semiconductor pattern and the active layer are in an identical layer, the second conductive pattern, the source electrode, and the drain electrode are in an identical layer, and the first conductive pattern and at least one of a group consisting of the second capacitor electrode, the gate electrode, and the first capacitor electrode are in an identical layer.

For example, in the display substrate provided by at least one embodiment of the present disclosure, the first wires in the plurality of first wire groups of the first conductive pattern are configured to transmit scanning signals for pixel driving circuits of the pixel units, respectively.

For example, in the display substrate provided by at least one embodiment of the present disclosure, the each of the pixel units further comprises a light-emitting component, the light-emitting component is on a side of the pixel driving circuit away from the base substrate and is electrically connected to the pixel driving circuit, and the pixel driving circuit is configured to drive the light-emitting component to work.

For example, in the display substrate provided by at least one embodiment of the present disclosure, the first conductive pattern further comprises at least one fourth wire, and in the direction perpendicular to the base substrate, the fourth wire is spaced and insulated from at least one of a group consisting of the semiconductor pattern and the second conductive pattern, so as to be able to form a capacitor.

For example, in the display substrate provided by at least one embodiment of the present disclosure, the opening peripheral region comprises a first dam region, a second dam region, and an interval region, the first dam region at least partially surrounds the display region, the interval region at least partially surrounds the first dam region, and the second dam region at least partially surrounds the interval region; and an orthographic projection of the semiconductor pattern, the first conductive pattern, the second conductive pattern, and the plurality of via holes on the base substrate comprises a portion not overlapped with the first dam region.

At least one embodiment of the present disclosure further provides a display device, and the display device comprises the display substrate provided by any one of the embodiments of the present disclosure.

At least one embodiment of the present disclosure further provides a manufacturing method of a display substrate, and the manufacturing method comprises: providing a base substrate, forming a semiconductor pattern on the base substrate, forming a first conductive pattern on the semiconductor pattern, and forming a second conductive pattern on the first conductive pattern; the display substrate comprises a display region and a peripheral region surrounding the display region; the display region comprises an opening, and the peripheral region comprises an opening peripheral region at least partially in the opening; the semiconductor pattern, the first conductive pattern, and the second conductive pattern are in the opening peripheral region; the first conductive pattern is configured to transmit an electrical signal for the display region; the first conductive pattern comprises a plurality of first wire groups arranged side by side in a first direction, and each of the first wire groups comprises at least two first wires arranged side by side in the first direction; in a direction perpendicular to the base substrate, each of the at least two first wires is spaced and insulated from the semiconductor pattern and the second conductive pattern, respectively, so as to be able to form a capacitor; and the semiconductor pattern is electrically connected to the second conductive pattern through a plurality of via holes in the opening peripheral region, and the plurality of via holes are between adjacent first wire groups in the first direction.

For example, in the manufacturing method of the display substrate provided by at least one embodiment of the present disclosure, forming the first conductive pattern on the semiconductor pattern comprises: forming a first insulating layer on the semiconductor pattern, and forming the first conductive pattern on the first insulating layer; and forming the second conductive pattern on the first conductive pattern comprises: forming a second insulating layer on the first conductive pattern, and forming the second conductive pattern on the second insulating layer.

For example, the manufacturing method of the display substrate provided by at least one embodiment of the present disclosure further comprises: forming a pixel driving circuit of a pixel unit on the base substrate in the display region; the pixel driving circuit comprises a thin film transistor and a storage capacitor; the thin film transistor comprises a gate electrode, an active layer, a source electrode, and a drain electrode, and the storage capacitor comprises a first capacitor electrode and a second capacitor electrode opposite to the first capacitor electrode; and the semiconductor pattern and the active layer are in an identical layer, the second conductive pattern, the source electrode, and the drain electrode are in an identical layer, and the first conductive pattern and at least one of a group consisting of the second capacitor electrode, the gate electrode, and the first capacitor electrode are in an identical layer.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, with continuous popularization of electronic display products, users have higher requirements for functions and appearance of the electronic display products. In order to meet different actual needs of users, the appearance or display region of an electronic display product sometimes needs to be designed in an irregular or special shape.

Figure 1:
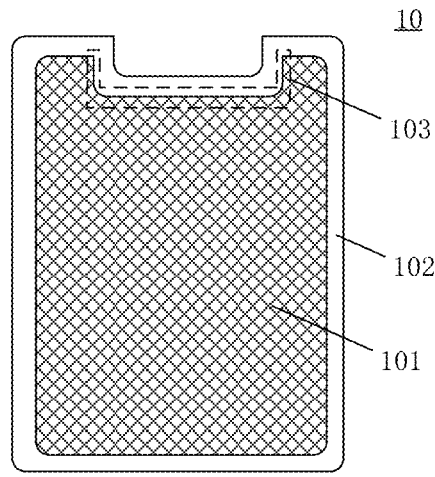
FIG. 1 is a schematic planar diagram of an OLED display device.

FIG. 1 is a schematic planar diagram of an OLED display device. For example, as illustrated in FIG. 1, the OLED display device 10 includes a display region 101 and a frame region 102 surrounding the display region 101. For example, the display region 101 is designed in an irregular shape with a notch 103 on at least one side of the display region 101. The display device 10 may be provided with devices such as a camera, a distance sensor, or the like in the area of the notch 103, so as to facilitate achieving a narrow-frame display device.

The display region 101 has the notch 103, and therefore, in a portion of the frame region 102 located in the notch 103, a plurality of metal wires generally need to be provided along an edge of the display region 101 outside the display region 101, so as to electrically connect a plurality of rows of pixel units in the display region 101 on both sides of the notch 103 correspondingly, so as to provide electrical signals such as scanning signals for the plurality of rows of pixel units. In addition, compared with the portion, which does not correspond to the notch 103, of the display region 101, the metal wires connecting pixel units in the display region on both sides of the notch 103 have lower loads for transmitting electrical signals, and therefore a plurality of signal compensation wires are usually provided under the metal wires, so that a capacitor may be formed between the signal compensation wire and the metal wire, thereby increasing the transmitting load of the metal wire, compensating for the electrical signal transmitting effect of the metal wire, and further avoiding display abnormality generated in the pixel units in the display region 101 on both sides of the notch 103.

Generally, at least one auxiliary electrode is provided in the frame region 102 to electrically connect the plurality of signal compensation wires to the power signal wire providing such as a driving current signal or a driving voltage signal, so that each of the plurality of signal compensation wires receives the electrical signal required for forming the compensation capacitor. The auxiliary electrode is usually provided above the plurality of signal compensation wires and the metal wires, and is electrically connected to the signal compensation wires through a plurality of via holes in the frame region 102, so that the capacitor formed between the auxiliary electrode and the metal wire may further increase the transmitting load of the metal wire, and the electrical signal transmitting effect of the metal wire may be better compensated.

At least one embodiment of the present disclosure provides a display substrate, and the display substrate includes a display region and a peripheral region surrounding the display region. The display region includes an opening, and the peripheral region includes an opening peripheral region at least partially located in the opening; the display substrate includes a base substrate and includes a semiconductor pattern, a first conductive pattern, and a second conductive pattern located in the opening peripheral region; the semiconductor pattern is located on the base substrate, the first conductive pattern is located on a side of the semiconductor pattern away from the base substrate, and the second conductive pattern is located on a side of the first conductive pattern away from the semiconductor pattern; the first conductive pattern is configured to transmit an electrical signal for the display region, the first conductive pattern includes a plurality of first wire groups arranged side by side in a first direction, and each of the first wire groups includes at least two first wires arranged side by side in the first direction; in a direction perpendicular to the base substrate, each of the at least two first wires is spaced and insulated from the semiconductor pattern and the second conductive pattern, respectively, so as to be able to form a capacitor; and the semiconductor pattern is electrically connected to the second conductive pattern through a plurality of via holes in the opening peripheral region, and the plurality of via holes are located between adjacent first wire groups in the first direction.

In the display substrate provided by the embodiments of the present disclosure, the plurality of via holes for electrically connecting the semiconductor pattern and the second conductive pattern are provided between adjacent first wire groups among the plurality of first wire groups, respectively, that is, in the first direction, the plurality of via holes are arranged at intervals of at least two first wires, so that the arrangement density of the via holes in the opening peripheral region can be reduced, and the entire size occupied by the plurality of first wires in the first direction can be reduced. Therefore, by optimizing the arrangement of the via holes in the opening peripheral region, the semiconductor pattern and the second conductive pattern may be respectively used to form the capacitor with the first wire, so as to compensate for the electrical signal transmitting effect while reducing the size occupied by the opening peripheral region in the first direction, thereby facilitating the narrow frame design of the display substrate.

Hereinafter, some embodiments of the present disclosure are described in detail with reference to the accompany drawings. It should be noted that the same reference numerals in different drawings are used to refer to the same described elements.

Figure 2A:
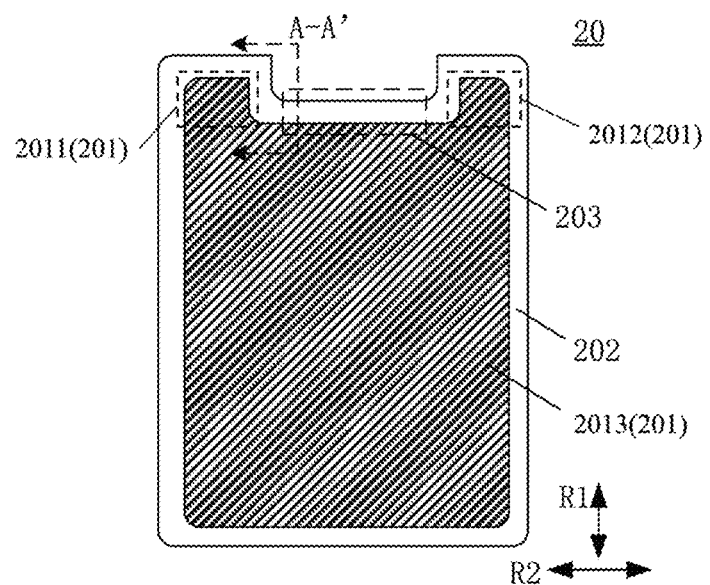
FIG. 2A is a schematic planar diagram of a display substrate provided by some embodiments of the present disclosure.
Figure 2B:
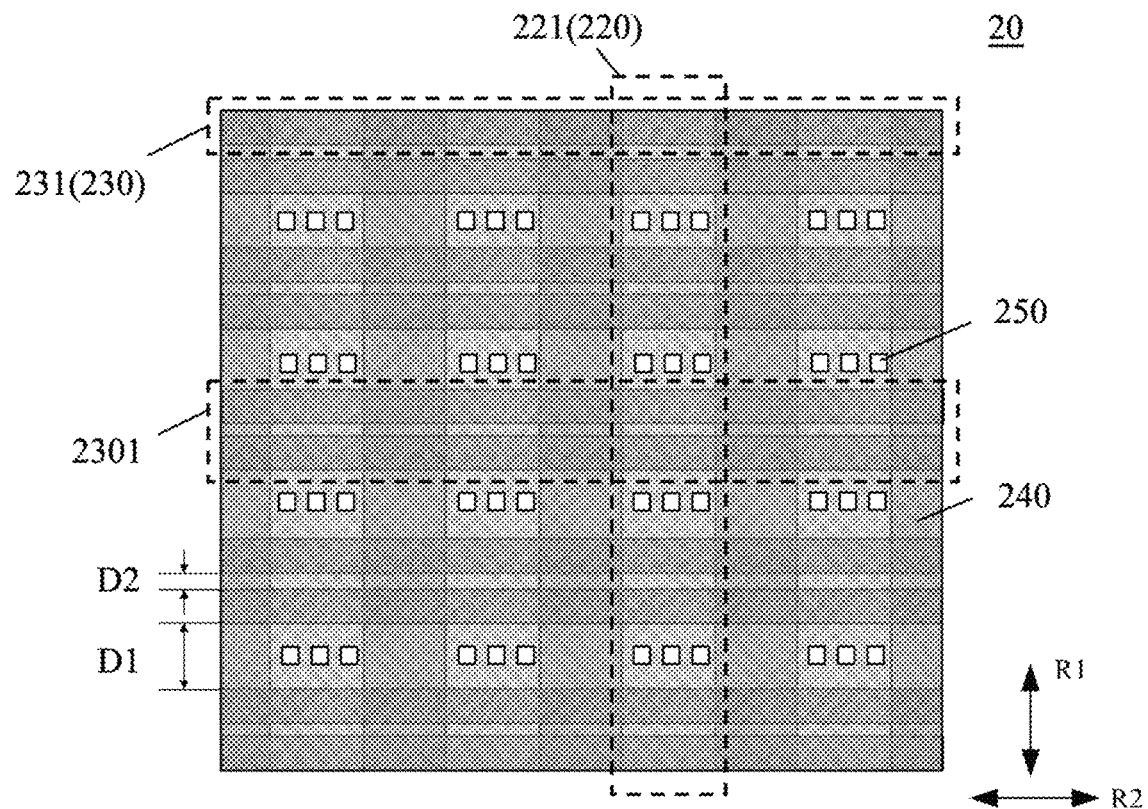
FIG. 2B is a schematic diagram of a partial planar structure in an opening peripheral region of a display substrate provided by some embodiments of the present disclosure.
Figure 2C:
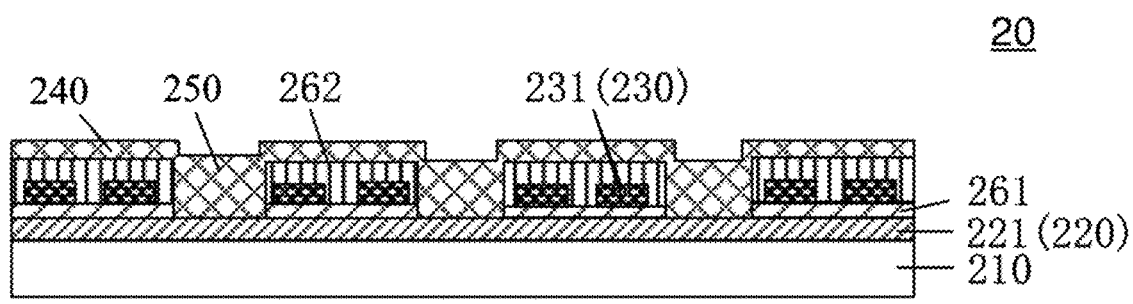
FIG. 2C is a schematic diagram of a partial cross-sectional structure in an opening peripheral region of a display substrate provided by some embodiments of the present disclosure.

FIG. 2A is a schematic planar diagram of a display substrate provided by some embodiments of the present disclosure, FIG. 2B is a schematic diagram of a partial planar structure in an opening peripheral region of a display substrate provided by some embodiments of the present disclosure, and FIG. 2C is a schematic diagram of a partial cross-sectional structure in an opening peripheral region of a display substrate provided by some embodiments of the present disclosure. For example, FIG. 2B may be a schematic diagram of an arrangement of the plurality of via holes in the opening peripheral region of the display substrate illustrated in FIG. 2A, and FIG. 2C may be a schematic diagram of a partial cross-sectional structure of the display substrate illustrated in FIG. 2A along an line AA'.

It should be noted that, for ease of description, FIG. 2B and FIG. 2C only show the arrangement relationship of the semiconductor pattern, the first conductive pattern, and the second conductive pattern, the design of other structures or functional layers in the display substrate may refer to conventional methods in the art, and details are not described herein.

For example, as illustrated in FIG. 2A to FIG. 2C, the display substrate 20 includes a display region 201 and a peripheral region 202 surrounding the display region 201. The display region 201 includes an opening, the opening may be a closed opening or a non-closed opening. Devices such as a camera, a distance sensor, or the like may be provided in the area where the opening is located, so as to facilitate achieving a narrow-frame display device. For example, the opening may be a notch (an example of a non-closed opening) formed on at least one side of the display region 201 illustrated in FIG. 2A, and the peripheral region 202 includes an opening peripheral region 203 at least partially located in the opening.

The display substrate 20 includes a base substrate 210, a semiconductor pattern 220, a first conductive pattern 230, and a second conductive pattern 240, and the semiconductor pattern 220, the first conductive pattern 230, and the second conductive pattern 240 are located in the opening peripheral region 203. The semiconductor pattern 220 is located on the base substrate 210, the first conductive pattern 230 is located on a side of the semiconductor pattern 220 away from the base substrate 210, and the second conductive pattern 240 is located on a side of the first conductive pattern 230 away from the semiconductor pattern 220. The first conductive pattern 230 is configured to transmit an electrical signal for the display region 201. For example, the electrical signal may be one or more of a group consisting of a gate scanning signal, a light-emitting control signal, a reset signal, and the like for a pixel driving circuit in the display region 201. The first conductive pattern 230 includes a plurality of first wire groups 2301 arranged side by side in the first direction R1, and each first wire group 2301 includes two first wires 231 arranged side by side in the first direction R1. In a direction perpendicular to the base substrate 210, the first wire 231 is spaced and insulated from the semiconductor pattern 220 and the second conductive pattern 240, so as to be able to form a capacitor. The semiconductor pattern 220 is electrically connected to the second conductive pattern 240 through a plurality of via holes 250 provided in the opening peripheral region 203, and the plurality of via holes 250 are located between adjacent first wire groups 2301 in the first direction R1.

In the display substrate 20 provided by the embodiments of the present disclosure, the plurality of via holes 250 for electrically connecting the semiconductor pattern 220 and the second conductive pattern 240 are respectively provided between adjacent first wire groups 2301, so that the plurality of via holes 250 are arranged in the first direction R1 with two first wires 231 spaced apart, thereby reducing the arrangement density of the via holes 250 in the opening peripheral region 203 and reducing the entire size occupied by the plurality of first wires 231 in each of the plurality of first wire groups 2301 in the first direction R1. Therefore, by optimizing the arrangement of the via holes 250 in the opening peripheral region 203, the semiconductor pattern 220 and the second conductive pattern 240 can be respectively used to form the capacitor with the first wire 231, so as to compensate for the electrical signal transmitting effect while reducing the size occupied by the opening peripheral region 203 in the first direction R1, thereby facilitating the narrow frame design of the display substrate 20.

For example, as illustrated in FIG. 2A and FIG. 2C, among the plurality of first wire groups 2301, regions, where via holes 250 are arranged in a substantially identical manner, are between adjacent first wire groups 2301 in the first direction R1. For example, among the plurality of first wire groups 2301, the via holes 250 are arranged between adjacent first wire groups 2301 in the first direction R1 is in the same manner or in the substantially same manner, that is, among the plurality of first wire groups 2301, there are regions, in which at least one of a group consisting of the number, density, spacing distance, arrangement, and the like of the via holes 250 is substantially the same, within a unit length range between adjacent first wire groups 2301 in the first direction R1. Therefore, the consistency of the capacitor environment of each first wire 231 may be improved, and the consistency of the signal transmitting load of each first wire 231 may be improved, thereby further improving the compensation effect. At the same time, it is also beneficial to improve the electrical connection effect between the semiconductor pattern 220 and the second conductive pattern 240, so as to better compensate for the signal transmitting effect of the first wire 231.

For example, a distance D1 between adjacent first wire groups 2301 in the first direction R1 is greater than a distance D2 between adjacent first wires 231 in the first wire group 2301 in the first direction R1. As a result, the size occupied by the plurality of first wires 231 as a whole in the first direction R1 may be further reduced, and the size occupied by the opening peripheral region 203 in the first direction R1 may be reduced, thereby facilitating achieving the narrow frame design of the display substrate 20.

In addition, compared to the manner in which the plurality of via holes in the opening peripheral region are arranged with one first wire spaced apart in the first direction R1, the distance between two adjacent first wires 231 in the first wire group 2301 in the first direction R1 is reduced in the display substrate 20 provided by the embodiments of the present disclosure, and therefore the capacitance formed between the two adjacent first wires 231 is increased, thereby further improving the transmitting load of the first wire 231 to achieve a better compensation effect, so that the display substrate 20 may provide a display image with better quality.

For example, among the plurality of first wire groups 2301, the distance D1 between adjacent first wire groups 2301 in the first direction R1 is the same or approximately the same, so that the consistency of the capacitor environment of the first wires 231 in the first wire group 2301 may be improved, and the consistency of the signal transmitting loads of the first wires 231 may be improved, thereby further improving the compensation effect for electrical signal transmission and facilitating improving the uniformity of the etching of the first wires 231 in the first wire group 2301, so as to facilitate the manufacture and processing of the first wires 231.

For example, among the plurality of first wire groups 2301, the arrangement of the two first wires 231 in each group in the first direction R1 is the same.

For example, in each first wire group 2301, extending directions of the two first wires 231 are substantially parallel to each other. For example, each of the two first wires 231 substantially extends along the second direction R2 illustrated in the figure.

For example, in each first wire group 2301, the distance D2 between adjacent first wires 231 in the first direction R1 may be the same or approximately the same. In this way, the capacitor environment of the plurality of first wires 231 in each of the plurality of first wire groups 2301 may be kept substantially the same, so that signal transmitting loads of the plurality of first wires 231 are substantially the same, thereby further optimizing the compensation effect for the signal transmission of the first wire 231.

It should be noted that in the embodiment illustrated in FIG. 2B, for ease of description, the two first wires 231 are both illustrated as long strips. For example, widths of the two first wires 231 in the first direction R1 may be identical. In some other embodiments of the present disclosure, according to actual requirements, the two first wires 231 may also such as have a bent shape including a corner region and a straight side region, and edges of the first wires 231 may be in a straight shape, a curved shape, a zigzag shape, etc., which is not limited in the embodiments of the present disclosure.

It should be noted that, in the embodiment illustrated in FIG. 2B, for ease of description, only the first wire 231 is illustrated in each first wire group 2301; while in some other embodiments of the present disclosure, according to actual requirements, each first wire group 2301 may also include other types of wires or structures, and the embodiments of the present disclosure are not limited in this aspect.

For example, the via holes 250 located on both sides of one first wire group 2301 in the first direction R1 are arranged in a substantially symmetrical manner with respect to the one first wire group 2301 along the extending direction (for example, the second direction R2 illustrated in the figure) of the first wire 231, thereby improving the consistency of the capacitor environment of the first wire 231, facilitating the processing and manufacture of the via holes 250, and further facilitating the improvement of the electrical connection effect between the semiconductor pattern 220 and the second conductive pattern 240.

For example, as illustrated in FIG. 2A to FIG. 2C, the semiconductor pattern 220 includes a plurality of conductive blocks 221 arranged side by side in the second direction R2, the plurality of conductive blocks 221 are electrically connected to the second conductive pattern 240 through the plurality of via holes 250, respectively, and the first direction R1 is different from the second direction R2. For example, the first direction R1 may be perpendicular to the second direction R2, so that the plurality of first wires 231 and the plurality of conductive blocks 221 are respectively arranged in a cross, so as to facilitate the consistency of the capacitors formed between the plurality of conductive blocks 221 and the plurality of first wires 231, thereby further improving the consistency of the transmitting loads of the first wires 231 and optimizing the compensation effect.

For example, each first wire 231 partially overlaps with the plurality of conductive blocks 221, and each conductive block 221 partially overlaps with the plurality of first wires 231. For example, the via hole 250 may be provided in the portion of the conductive block 221 not overlapped with the first wire 231, that is, the via hole 250 may be provided in the intervals between adjacent first wire groups 2301.

For example, widths of the plurality of conductive blocks 221 in the second direction R2 are identical, and the distance between adjacent conductive blocks 221 in the second direction R2 may be identical or approximately identical, so as to improve the consistency of the capacitors formed between the plurality of conductive blocks 221 and the first wires 231, and improve the consistency of the transmitting loads of the first wires 231, thereby optimizing the compensation effect on the signal transmission of the first wires 231.

For example, the second conductive pattern 240 is continuously provided in the opening peripheral region 203, and for example, may be provided in a whole piece, thereby facilitating the electrical connection between the second conductive pattern 240 and the plurality of conductive blocks 221.

For example, in the display substrate 20 provided by the embodiments of the present disclosure, a row of via holes 250 arranged in the extending direction (for example, the second direction R2) of the first wire 231 is provided between adjacent first wire groups 2301 in the first direction R1; and in some other embodiments of the present disclosure, for example, two rows, three rows, or the like of via holes 250 arranged in the extending direction of the first wire 231 may be provided between adjacent first wire groups 2301 in the first direction R1, that is, the plurality of via holes 250 may be arranged in an array between adjacent first wire groups 2301, and the embodiments of the present disclosure are not limited in this aspect.

It should be noted that, in the embodiments of the present disclosure, the specific number of the via holes 250 between adjacent first wire groups 2301 shown in FIG. 2B is only an exemplary illustration. For example, in some other embodiments of the present disclosure, the number of via holes 250 provided between adjacent first wire groups 2301 may be determined according to different actual needs, for example, according to factors such as the width of the conductive block 221 in the second direction R2, the precision of the preparation process, etc., and the embodiments of the present disclosure are not limited in this aspect.

For example, as illustrated in FIG. 2A to FIG. 2C, the display substrate 20 further includes a first insulating layer 261 and a second insulating layer 262. The first insulating layer 261 and the second insulating layer 262 are located at least in the opening peripheral region 203. The first insulating layer 261 is located on a side of the semiconductor pattern 220 away from the base substrate 210, the first conductive pattern 230 is located on a side of the first insulating layer 261 away from the semiconductor pattern 220, the second insulating layer 262 is located on a side of the first conductive pattern 230 away from the first insulating layer 261, and the second conductive pattern 240 is located on a side of the second insulating layer 262 away from the first conductive pattern 230. The plurality of via holes 250 are located at least in the first insulating layer 261 and the second insulating layer 262, and penetrate at least the first insulating layer 261 and the second insulating layer 262.

For example, the plurality of conductive blocks 221 in the semiconductor pattern 220 and the plurality of first wires 231 in the first conductive pattern 230 use the first insulating layer 261 as a dielectric material to form the capacitor, and the second conductive pattern 240 and the plurality of first wires 231 in the first conductive pattern 230 use the second insulating layer 262 as a dielectric material to form the capacitor, thereby increasing the transmitting loads of the plurality of first wires 231, and compensating for the electrical signal transmitting effect of the plurality of first wires 231, so that the display effect of each part of the display region 201 of the display substrate 20 may be kept uniform.

It should be noted that in the embodiments of the present disclosure illustrated in FIG. 2A to FIG. 2C, only one first insulating layer 261 is provided between the semiconductor pattern 220 and the first conductive pattern 230, and only one second insulating layer 262 is provided between the first conductive pattern 230 and the second conductive pattern 240. In some other embodiments of the present disclosure, in addition to the first insulating layer 261, other insulating layers, other structural layers or functional layers, or the like may be provided between the semiconductor pattern 220 and the first conductive pattern 230. In addition to the second insulating layer 262, other insulating layers, other structural layers or functional layers, or the like may also be provided between the first conductive pattern 230 and the second conductive pattern 240, as long as the via holes 250 can penetrate the corresponding insulating layer to allow the semiconductor pattern 220 to be electrically connected to the second conductive pattern 240 and further allow the compensation capacitor to be respectively formed between the first conductive pattern 230 and the semiconductor pattern 220 and between the first conductive pattern 230 and the second conductive pattern 240, and the embodiments of the present disclosure are not limited in this aspect.

For example, the display substrate 20 provided by some embodiments of the present disclosure further includes a power wire pattern, and the power wire pattern may be provided in the same layer as the second conductive pattern 240, or may be provided on a side of the second conductive pattern 240 away from the base substrate 210. The power wire pattern is electrically connected to the second conductive pattern 240 to provide an electrical signal. For example, the semiconductor pattern 220 is electrically connected to the second conductive pattern 240 through the via hole 250 and is further electrically connected to the power wire pattern. For example, the electrical signal provided by the power wire pattern may be a high voltage signal or a low voltage signal.

For example, the power wire pattern may be configured to receive a low voltage signal (for example, a cathode signal provided to the pixel unit in the display region 201, which may be represented such as by VSS), and the power wire pattern may be located on a side of the second conductive pattern 240 away from the base substrate 210 and is electrically connected to the second conductive pattern 240 in a direct contact manner or through a via hole structure, so as to provide the low voltage signal. Furthermore, the low voltage signal is applied to the second conductive pattern 240 and the plurality of conductive blocks 221 in the semiconductor pattern 220, thereby enabling the first wire 231, which transmits an electrical signal such as a gate scanning signal, to form the capacitor respectively with the conductive block 221 and the second conductive pattern 240, so as to achieve the compensation effect.

For example, the power wire pattern may be configured to receive a high voltage signal (for example, a high voltage signal provided to the pixel unit in the display region 201, which may be represented such as by VDD). The power wire pattern may be provided in the same layer as the second conductive pattern 240. For example, the power wire pattern is located in the display region 201 and is connected to the second conductive pattern 240 located in the peripheral region 202 in the same layer, so as to provide the high voltage signal. Furthermore, the high voltage signal is applied to the second conductive pattern 240 and the plurality of conductive blocks 221 in the semiconductor pattern 220, thereby enabling the first wire 231, which transmits an electrical signal such as a gate scanning signal, to form the capacitor respectively with the conductive block 221 and the second conductive pattern 240, so as to achieve the compensation effect.

It should be noted that, in some other embodiments of the present disclosure, the display substrate may also include, for example, other structures or functional layers in the opening peripheral region in addition to the semiconductor pattern, the first conductive pattern, the second conductive pattern, the first insulating layer, the second insulating layer, and the like, as long as the capacitor can be respectively formed between the first conductive pattern and the semiconductor pattern and between the first conductive pattern and the second conductive pattern to achieve the compensation effect. The embodiments of the present disclosure are not limited in this aspect.

For example, the base substrate 210 may be a glass plate, a quartz plate, a metal plate, a resin plate, or the like. For example, the material of the base substrate 210 may include an organic material, and for example, the organic material may be a resin material, such as polyimide, polycarbonate, polyacrylate, polyetherimide, polyethersulfone, polyethylene glycol terephthalate, polyethylene naphthalene two formic acid glycol ester, or the like. For example, the base substrate 210 may be a flexible substrate or a non-flexible substrate, which is not limited in the embodiments of the present disclosure.

For example, the materials of the first insulating layer 261 and the second insulating layer 262 may include an inorganic insulating material such as silicon oxide, silicon nitride, silicon oxynitride, etc., or may include an organic insulating material such as polyimide, polyphthalimide, polyphthalamide, acrylic resin, benzocyclobutene, phenol-formaldehyde resin, or the like. The embodiments of the present disclosure do not specifically limit the materials of the first insulating layer and the second insulating layer. For example, the materials of the first insulating layer and the second insulating layer may be the same or partially the same as each other, or may be different from each other, and the embodiments of the present disclosure are not limited in this aspect.

For example, the material of the plurality of conductive blocks 221 of the semiconductor pattern 220 may include polysilicon or the oxide semiconductor (for example, indium gallium zinc oxide).

For example, the material of the plurality of first wires 231 of the first conductive pattern 230 may include a metal material or an alloy material, such as a metal single-layer or multi-layer structure formed by such as molybdenum, aluminum, titanium, etc. For example, each of the plurality of first wires 231 of the first conductive pattern 230 may adopt the same material, or the plurality of first wires 231 of the first conductive pattern 230 may also be formed alternately adopting different materials, and the embodiments of the present disclosure are not limited in this aspect.

For example, the plurality of first wires 231 may be formed in the same layer as a certain structure in the pixel unit in the display region 201. The plurality of first wires 231 may also be formed in the same layer as two structures in the pixel unit in the display region 201, that is, a part of the plurality of first wires 231 is formed in the same layer as one structure in the pixel unit, and the other part of the plurality of the first wires 231 is formed in the same layer as another structure in the pixel unit. In some embodiments, these two parts of the first wires 231 are alternately arranged to form the plurality of first wires 231. Alternatively, the plurality of first wires 231 may also be formed in the same layer as three structures in the pixel unit in the display region 201, that is, a first part of the first wires 231 is formed in the same layer as a first structure in the pixel unit, a second part of the first wires 231 is formed in the same layer as a second structure in the pixel unit, and a third part of the first wires 231 is formed in the same layer as a third structure in the pixel unit. The embodiments of the present disclosure are not limited in this aspect.

For example, the first wire 231 may be formed in the same layer as a signal line that transmits a corresponding electrical signal (such as a gate scanning signal, a light-emitting control signal, a reset signal, etc.) in the display region 201, so that the first wire 231 and the signal line may be connected in an identical layer to realize electrical signal transmission. Alternatively, the first wire 231 may also be located in a different layer from the signal line in the display region 201 that transmits the corresponding electrical signal (such as the gate scanning signal, the light-emitting control signal, the reset signal, etc.), and for example, the first wire 231 may be electrically connected to the signal line through a via hole structure to realize electrical signal transmission. The embodiments of the present disclosure are not limited in this aspect.

For example, the material of the second conductive pattern 240 may include a metal material or an alloy material, such as a metal single-layer or multi-layer structure formed of molybdenum, aluminum, titanium, etc. For example, the multi-layer structure is a stacked layer of multiple metal layers (such as a stacked layer of three metal layers of an aluminum layer, a titanium layer, and an aluminum layer (Al/Ti/Al)).

For example, as illustrated in FIG. 2A to FIG. 2C, the display region 201 includes a first display region 2011 and a second display region 2012, and the first display region 2011 and the second display region 2012 are located on two opposite sides of the opening. The first display region 2011, the opening, and the second display region 2012 are sequentially arranged in the extending direction (for example, the second direction R2) of the first wire 231, and the first wire 231 sequentially extends through the first display region 2011, the opening peripheral region 203, and the second display region 2012, so as to transmit an electrical signal for the first display region 2011 and the second display region 2012. For example, in the opening peripheral region 203, the first wire 231 extends along the edge of the display region 201 where the opening is formed.

For example, by forming capacitors between the plurality of first wires 231 and the plurality of conductive blocks 221 and forming capacitors between the plurality of first wires 231 and the second conductive pattern 240, the transmitting loads of the first wires 231 can be increased, and the electrical signal transmitting effect of the first wires 231 may be compensated. In this way, the display effect of the pixel units in the first display region 2011 and the second display region 2012 may be kept consistent with the display effect of other pixel units in the display region 201 (for example, the pixel units located in the third display region 2013 described in the following), thereby avoiding or reducing the display abnormality of the image in different gray levels, and improving the image display effect of the display substrate 20.

For example, one first wire 231 may be provided corresponding to each row of pixel units located in the first display region 2011 and the second display region 2012, so as to transmit one of electrical signals such as a gate scanning signal, a light-emitting control signal, a reset signal, and the like. For example, gate lines of each row of pixel units located in the first display region 2011 and the second display region 2012 may be electrically connected through the first wire 231, so as to transmit the gate scanning signal. For example, a plurality of first wires 231 may be provided for each row of pixel units located in the first display region 2011 and the second display region 2012 to respectively transmit the above various electrical signals. For example, the gate lines and the light-emitting control lines of each row of pixel units in the first display region 2011 and the second display region 2012 are electrically connected through the first wires 231, respectively, so as to transmit the gate scanning signal and the light-emitting control signal, respectively. The embodiments of the present disclosure are not limited in this aspect.

For example, the display region 201 further includes a third display region 2013, and the third display region 2013 is connected to one of two opposite edges of the first display region 2011 in the first direction R1, and is connected to one of two opposite edges of the second display region 2012 in the first direction R1.

For example, two opposite edges of the third display region 2013 in a direction (for example, the second direction R2) perpendicular to the first direction R1 are aligned with the edge of the first display region 2011 away from the opening in the direction perpendicular to the first direction R1, and the edge of the second display region 2012 away from the opening in the direction perpendicular to the first direction R1, respectively. For example, one of the two opposite edges of the third display region 2013 in the second direction R2 is aligned with and connected to the edge of the first display region 2011 away from the opening in the second direction R2, and the other edge is aligned with and connected to the edge of the second display region 2012 away from the opening in the second direction R2, thereby forming a complete and continuous display region 201.

For example, the display substrate 20 includes a plurality of third wires located in the third display region 2013, and an extending direction of the plurality of third wires is identical to the extending direction of the first wires 231, and the plurality of third wires are configured to transmit electrical signals for the third display region 2013. For example, the signal type transmitted by the third wire is the same as the electrical signal type transmitted by the first wire 231, and for example, the signal transmitted by the third wire may be one or more of a group consisting of a gate scanning signal, a light-emitting control signal, a reset signal, and the like used for the pixel driving circuit in the display region 201, so that the display substrate 20 achieves the display function. For example, the plurality of third wires may be provided in the same layer as the first wires.

Figure 3:
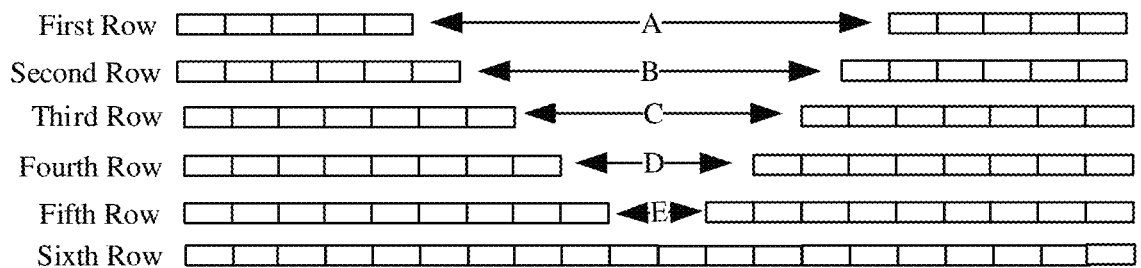
FIG. 3 is a schematic planar diagram of an arrangement of pixel units near an opening peripheral region of a display substrate provided by some embodiments of the present disclosure.

For example, FIG. 3 shows six rows of pixel units near the opening peripheral region 203. For example, in some examples, as illustrated in FIG. 3, it is assumed that the sixth row of pixel units is a full row of pixel units. For example, the sixth row of pixel units may be a row of pixel units located in the third display region 2013 illustrated in FIG. 2A. The total transmitting load of the sixth row of pixel units is M. The first to fifth rows of pixel units are pixel units located on both sides of the opening, and for example, the first to fifth rows of pixel units may be located in the first display region 2011 and the second display region 2012 illustrated in FIG. 2A. The first to fifth rows of pixel units are non-full rows of pixel units, and the number of pixel units gradually increases from the first row to the fifth row. In this case, by compensating for the transmitting loads of the first wires 231 which transmit the electrical signals corresponding to the first row to the fifth row of pixel units, the total transmitting load of each row of pixel units may be approximating to or basically equal to M.

For example, in some examples, because of the limited space of the opening peripheral region 203, for example, lengths, corresponding to the first row to the fifth row, of the opening peripheral region 203 in the second direction R2 are A, B, C, D, and E, respectively. After compensation, the total transmitting load of each row of pixel units in the first to fifth rows may still be difficult to reach M. In this case, the total transmitting loads of the first to fifth rows of pixel units can gradually increase, that is, a compensation solution of gradual change of the total transmitting load of each row of pixel units may be adopted to allow the compensation effect of electrical signals corresponding to the first to fifth rows of the pixel units to be gradually increased, so that the display effect of the non-full rows of pixel units after compensation may gradually approach the display effect of the full row of pixel units. As a result, the influence of the signal transmitting load of the non-full row of pixel units on the display effect is reduced, thereby facilitating the narrow frame design of the display substrate 20 while enabling the display substrate 20 to provide a display image of better quality.

For example, after compensation, the total transmitting loads of the first to fifth rows of the pixel units are $V/100 \times M$, $U/100 \times M$, $T/100 \times M$, $S/100 \times M$, and $R/100 \times M$, respectively, where $R>S>T>U>V$, $R \leq 100$, and R, S, T, U, and V are shares occupied by the transmitting loads of the first to fifth rows of the pixel units in the case where M is 100 shares.

It should be noted that in the display substrate 20 provided by the embodiments of the present disclosure, FIG. 2B and FIG. 2C only show the case that both the semiconductor pattern 220 and the second conductive pattern 240 form capacitors with the plurality of first wires 231. However, in some other embodiments of the present disclosure, the first conductive pattern 230 may include a wire that is only insulated and spaced apart from one of the semiconductor pattern 220 and the second conductive pattern 240 in the direction perpendicular to the base substrate 210 to be able to form a capacitor, and the embodiments of the present disclosure are not limited in this aspect.

For example, in some embodiments of the present disclosure, the first conductive pattern 230 further includes at least one fourth wire. In the direction perpendicular to the base substrate 210, the fourth wire is spaced and insulated from at least one of a group consisting of the semiconductor pattern 220 and the second conductive pattern 240, so as to be able to form a capacitor. For example, the fourth wire may be only spaced and insulated from the semiconductor pattern 220 to form a capacitor, or may be only spaced and insulated from the second conductive pattern 240 to form a capacitor. Alternatively, the fourth wire may also adopt an arrangement manner similar to that of the first wire 231, so that the fourth wire may be spaced and insulated from the semiconductor pattern 220 and the second conductive pattern 240 to be able to form the capacitor, and the embodiments of the present disclosure are not limited in this aspect.

For example, the fourth wire may also be used for signal transmission of pixel units in the first display region 2011 and the second display region 2012 located on both sides of the opening. The capacitor may be formed between the fourth wire and at least one of a group consisting of the semiconductor pattern 220 and the second conductive pattern 240 to compensate for the signal transmitting effect, thereby improving the display effect of the display image. For example, the fourth wire may be arranged in the same layer as the first wire 231 and may adopt such as the same material or structure as the first wire 231. The structure, material, function and the like of the fourth wire may be with reference to the above descriptions of the first wire 231, and details are not described herein.

Figure 4:
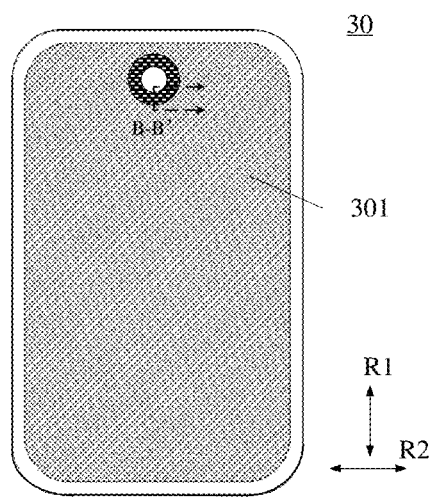
FIG. 4 is a schematic planar diagram of another display substrate provided by some embodiments of the present disclosure.

It should be noted that the cross-sectional structure illustrated in FIG. 2C may correspond to the cross-sectional structure of the display substrate 20 illustrated in FIG. 2A along the line AA'; or in some other embodiments of the present disclosure, the cross-sectional structure illustrated in FIG. 2C may also correspond to the cross-sectional structure of the display substrate 30 (including the display region 301) illustrated in FIG. 4 along the line BB'. The opening of the display substrate 30 illustrated in FIG. 4 is closed. That is, the embodiments of the present disclosure do not limit the specific shape and position of the opening in the display region of the display substrate.

It should be noted that the embodiments of the present disclosure do not limit the shape or contour of the display substrate. For example, the display substrate provided by the embodiments of the present disclosure may be in a square shape as illustrated in FIG. 2A or FIG. 4, or may be in other suitable regular shapes, such as a circle shape, a regular hexagon shape, a regular octagon shape, etc., or irregular shapes, and the embodiments of the present disclosure are not limited in this aspect.

In some embodiments of the present disclosure, the opening peripheral region 203 includes a first dam region, a second dam region, and an interval region. The first dam region at least partially surrounds the display region 201, the interval region at least partially surrounds the first dam region, and the second dam region at least partially surrounds the interval region. The orthographic projection of the semiconductor pattern 220, the first conductive pattern 230, the second conductive pattern 240, and the plurality of via holes 250 on the base substrate 210 includes a portion that does not overlap with the first dam region.

For example, the orthographic projections of the semiconductor pattern 220, the first conductive pattern 230, and the second conductive pattern 240, used to form the compensation structure, on the base substrate 210 do not overlap with the first dam region, and also do not overlap with the interval region or the second dam region, that is, the semiconductor pattern 220, the first conductive pattern 230, and the second conductive pattern 240 are not disposed in the first dam region, the interval region, and the second dam region which form the dam structure, so as to avoid mutual influence with such as the power wire or the like provided in the first dam region, the interval region, and the second dam region, thereby further improving the stability of the display substrate.

In some embodiments of the present disclosure, the semiconductor pattern 220, the first conductive pattern 230, the second conductive pattern 240, and the plurality of via holes 250 may also be partially disposed in the first dam region, or may be further disposed in the interval region and the second dam region, thereby optimizing the layout structure of the display substrate and facilitating the narrow frame design.

Figure 5A:
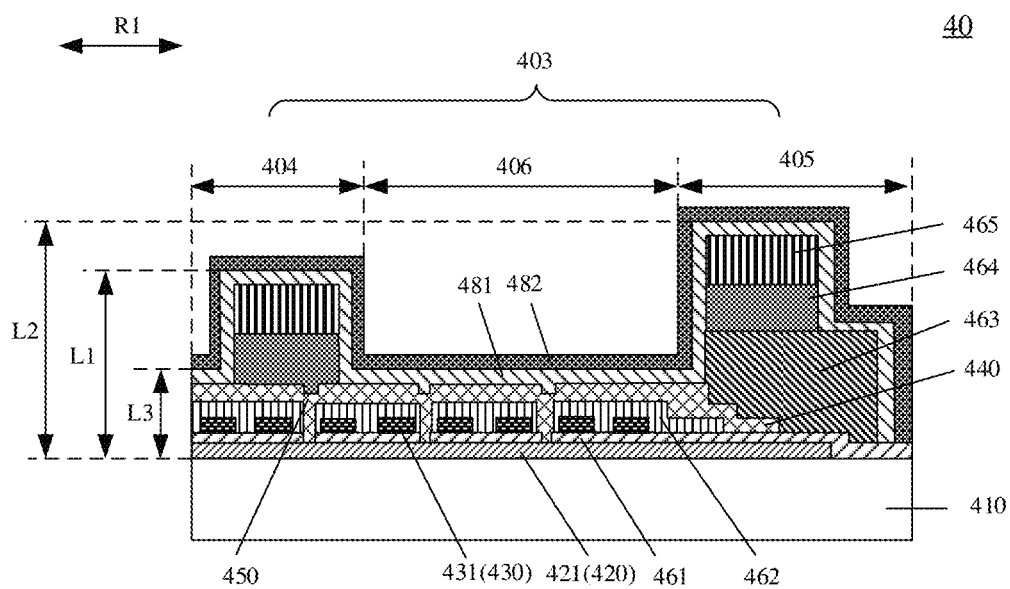
FIG. 5A is a schematic diagram of a specific example of a partial cross-sectional structure in an opening peripheral region of a display substrate provided by some embodiments of the present disclosure.
Figure 5B:
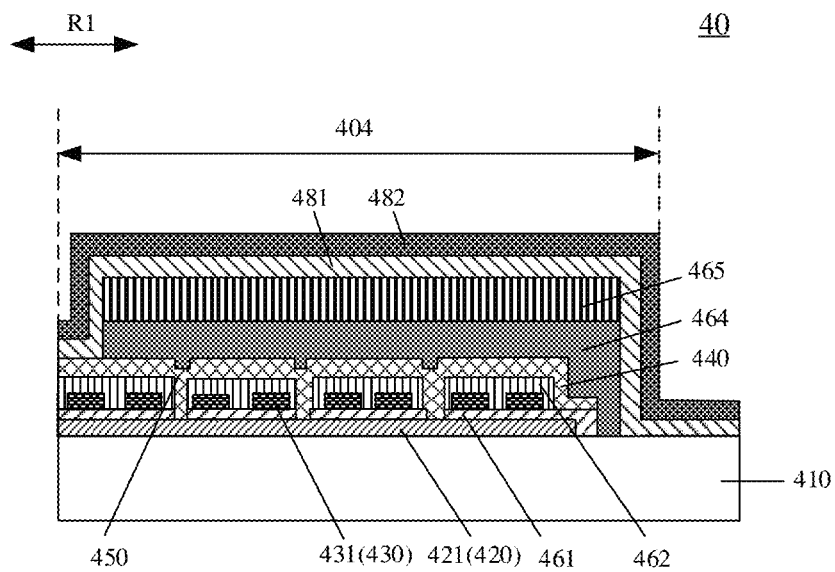
FIG. 5B is a schematic diagram of a specific example of a partial cross-sectional structure in an opening peripheral region of another display substrate provided by some embodiments of the present disclosure.

FIG. 5A is a schematic diagram of a specific example of a partial cross-sectional structure in an opening peripheral region of a display substrate provided by some embodiments of the present disclosure, and FIG. 5B is a schematic diagram of a specific example of a partial cross-sectional structure in an opening peripheral region of another display substrate provided by some embodiments of the present disclosure. For example, both FIG. 5A and FIG. 5B may be schematic diagrams of the cross-sectional structure of the display substrate illustrated in FIG. 2A along the line A-A', or may also be schematic diagrams of the cross-sectional structure of the display substrate illustrated in FIG. 4 along the line B-B'.

It should be noted that the difference between the examples illustrated in FIG. 5A and FIG. 5B is only the arrangement positions of the first conductive pattern 430 (for example, including the plurality of first wires 431), the corresponding semiconductor pattern 420 (for example, including the plurality of conductive blocks 421), and the corresponding second conductive pattern 440 in the opening peripheral region 403. For example, in the example illustrated in FIG. 5A, in the opening peripheral region 403, the first conductive pattern 430 is located in the first dam region 404 and further located in the interval region 406, and the semiconductor pattern 420 and the second conductive pattern 440 are located in the first dam region 404, the interval region 406, and the second dam region 405. In the example illustrated in FIG. 5B, in the opening peripheral region 403, the first conductive pattern 430, the semiconductor pattern 420, and the second conductive pattern 440 are only located in the first dam region 404. The embodiments of the present disclosure do not limit the arrangement positions of the first conductive pattern 430, the semiconductor pattern 420, and the second conductive pattern 440 in the opening peripheral region 403. In the following, the display substrate 40 is described in detail by taking the example illustrated in FIG. 5A as an example, the example illustrated in FIG. 5B may refer to the corresponding descriptions related to FIG. 5A, and details are not described herein.

For example, the display substrate 40 illustrated in FIG. 5A may be a specific example of the display substrate 20 illustrated in FIG. 2A to FIG. 2C. For example, the planar structure of the display substrate 40, the arrangement of the via holes 450 in the opening peripheral region 403, and the like may refer to the corresponding descriptions in the above embodiments of the display substrate 20, and details are not described herein.

For example, structures of the display substrate 40, such as the base substrate 410, the semiconductor pattern 420 (for example, including the plurality of conductive blocks 421), the first conductive pattern 430 (for example, including the plurality of first wires 431), the second conductive pattern 440, the first insulating layer 461, the second insulating layer 462, and the like, are substantially the same as or similar to the structures of the display substrate 20, such as the base substrate 210, the semiconductor pattern 220, the first conductive pattern 230, the second conductive pattern 240, the first insulating layer 261, the second insulating layer 262, and the like, and details are not described herein.

For example, as illustrated in FIG. 5A, the opening peripheral region 403 includes a first dam region 404, a second dam region 405, and an interval region 406. The first dam region 404 at least partially surrounds the display region of the display substrate 40, the interval region 406 at least partially surrounds the first dam region 404, and the second dam region 405 at least partially surrounds the interval region 406. The semiconductor pattern 420, the first conductive pattern 430, the second conductive pattern 440, and the plurality of via holes 450 are located at least in the first dam region 404.

For example, in the display substrate 40 illustrated in FIG. 5A, the semiconductor pattern 420 and the second conductive pattern 440 are located in the first dam region 404, the second dam region 405, and the interval region 406. The first conductive pattern 430 is located in the first dam region 404 and the interval region 406. The plurality of via holes 450 are located in the first dam region 404 and the interval region 406. In some other embodiments of the present disclosure, the first conductive pattern 430 may also be located in the first dam region 404, the second dam region 405, and the interval region 406, and the plurality of via holes 450 may be located in the first dam region 404, the second dam region 405, and the interval region 406, or may be located in the first dam region 404 and the second dam region 405. The embodiments of the present disclosure are not limited in this aspect.

For example, in the example illustrated in FIG. 5A, the display substrate 40 further includes a power wire pattern (not shown) located in the display region, and the power wire pattern and the second conductive pattern 440 may be arranged in the same layer and connected with each other in the same layer, so as to provide a required electrical signal to the second conductive pattern 440 and further to the semiconductor pattern 420. For example, the electrical signal may be a high voltage signal, or may also be a low voltage signal or a ground signal, etc., and the embodiments of the present disclosure are not limited in this aspect.

For example, in some other examples, the power wire pattern may also be located in the opening peripheral region 403 and on a side of the second conductive pattern 440 away from the base substrate 410, and the power wire pattern may be electrically connected to the second conductive pattern 440 in a direct contact manner or through a via hole structure, so as to provide a corresponding electrical signal, which is not limited in the embodiments of the present disclosure.

For example, the material of the power wire pattern may include at least one conductive oxide material, which includes indium tin oxide (ITO), indium zinc oxide (IZO), zinc oxide (ZnO), etc., or the material of the power wire pattern may also include a metal with high reflectivity as a reflective layer, such as silver (Ag).

For example, as illustrated in FIG. 5A, the display substrate 40 further includes a first encapsulation layer 481, and the first encapsulation layer 481 is located on a side of the second conductive pattern 440 away from the base substrate 410.

For example, as illustrated in FIG. 5A, the display substrate 40 further includes a first dam structure and a second dam structure. The first dam structure is located in the first dam region 404, and the second dam structure is located in the second dam region 405. In the first dam region 404, the first dam structure is located on a side of the second conductive pattern 440 away from the base substrate 410, and the first encapsulation layer 481 is located on a side of the first dam structure away from the second conductive pattern 440 and covers the first dam structure. In the second dam region 405, the second dam structure is located on a side of the second conductive pattern 440 away from the base substrate 410, part of the second dam structure covers the second conductive pattern 440, and the first encapsulation layer 481 is located on a side of the second conductive pattern 440 and the second dam structure away from the base substrate 410 and covers the second conductive pattern 440 and the second dam structure.

For example, as illustrated in FIG. 5A, a maximum distance L1 between the base substrate 410 and a surface of a portion, in the first dam region 404, of the first encapsulation layer 481 away from the base substrate 410 is greater than a maximum distance L3 between the base substrate 410 and a surface of a portion, in the interval region 406, of the first encapsulation layer 481 away from the base substrate 410. A maximum distance L2 between the base substrate 410 and a surface of a portion, in the second dam region 405, of the first encapsulation layer 481 away from the base substrate 410 is greater than the maximum distance L3 between the base substrate 410 and the surface of the portion, in the interval region 406, of the first encapsulation layer 481 away from the base substrate 410. Therefore, a "notch" is formed in the opening peripheral region 403 of the display substrate 40 by the first dam structure and the second dam structure, which can effectively block such as water vapor, oxygen, or the like from penetrating into the inside of the display component of the display substrate 40 after encapsulation, and avoid adverse effects on the functional layers, structural layers, and the like of the display component.

For example, as illustrated in FIG. 5A, the maximum distance L1 between the base substrate 410 and the surface of the portion, in the first dam region 404, of the first encapsulation layer 481 away from the base substrate 410 is smaller than the maximum distance L2 between the base substrate 410 and the surface of the portion, in the second dam region 405, of the first encapsulation layer 481 away from the base substrate 410. Therefore, the first dam structure and the second dam structure with different heights from the base substrate 410 may more effectively prevent such as water vapor, oxygen, or the like from penetrating into the inside of the display component of the display substrate 40 after encapsulation, and further avoid adverse effects on various functional layers, structural layers, and the like of the display component.

For example, as illustrated in FIG. 5A, the display substrate 40 further includes a third insulating layer 463, a fourth insulating layer 464, and a fifth insulating layer 465 located in the opening peripheral region 403 except for the interval region 406. The first dam structure includes a stack of the fourth insulating layer 464 and the fifth insulating layer 465, and the second dam structure includes a stack of the third insulating layer 463, the fourth insulating layer 464, and the fifth insulating layer 465.

In the first dam region 404, the fourth insulating layer 464 is located on a side of the second conductive pattern 440 away from the base substrate 410, the fifth insulating layer 465 is located on a side of the fourth insulating layer 464 away from the second conductive pattern 440, and the first encapsulation layer 481 is located on a side of the fifth insulating layer 465 away from the fourth insulating layer 464 and covers a surface of the fifth insulating layer 465 away from the base substrate 410, at least one side surface of the fifth insulating layer 465, and at least one side surface of the fourth insulating layer 464.

In the second dam region 405, the third insulating layer 463 is located on a side of the second conductive pattern 440 away from the base substrate 410, the fourth insulating layer 464 is located on a side of the third insulating layer 463 away from the second conductive pattern 440, the fifth insulating layer 465 is located on a side of the fourth insulating layer 464 away from the third insulating layer 463, and the first encapsulation layer 481 is located on a side of the fifth insulating layer 465 away from the fourth insulating layer 464 and covers a surface of the fifth insulating layer 465 away from the base substrate 410, at least one side surface of the fifth insulating layer 465, at least one side surface of the fourth insulating layer 464, a part of a surface of the third insulating layer 463 away from the base substrate 410, a side surface of the third insulating layer 463 away from the first dam region 404, and a part of a side surface of the third insulating layer 463 close to the first dam region 404. The third insulating layer 463 covers a part of a surface of the second conductive pattern 440 away from the base substrate 410.

For example, as illustrated in FIG. 5A, the display substrate 40 further includes a second encapsulation layer 482. The second encapsulation layer 482 is located on a side of the first encapsulation layer 481 away from the base substrate 410 and covers the first encapsulation layer 481. For example, both the first encapsulation layer 481 and the second encapsulation layer 482 may be organic encapsulation layers. The stacked arrangement of the first encapsulation layer 481 and the second encapsulation layer 482 may further make it difficult for such as water vapor, oxygen, or the like to penetrate into the inside of the display component of the display substrate 40.

For example, materials of the third insulating layer 463, the fourth insulating layer 464, and the fifth insulating layer 465 may include inorganic insulating materials such as silicon oxide, silicon nitride, silicon oxynitride, etc., or may include organic insulating materials such as polyimide, polyphthalimide, polyphthalamide, acrylic resin, benzocyclobutene, phenol-formaldehyde resin, or the like. The embodiments of the present disclosure do not specifically limit the materials of the third insulating layer, the fourth insulating layer, and the fifth insulating layer. For example, the materials of the third insulating layer, the fourth insulating layer, and the fifth insulating layer may be the same or partially the same as each other, and may also be different from each other, and the embodiments of the present disclosure are not limited in this aspect.

For example, materials of the first encapsulation layer 461 and the second encapsulation layer 462 may include insulating materials such as silicon nitride, silicon oxide, silicon oxynitride, etc. Inorganic materials such as silicon nitride, silicon oxide, silicon oxynitride, and the like have high density and may prevent the intrusion of water vapor, oxygen, or the like.

Figure 6:
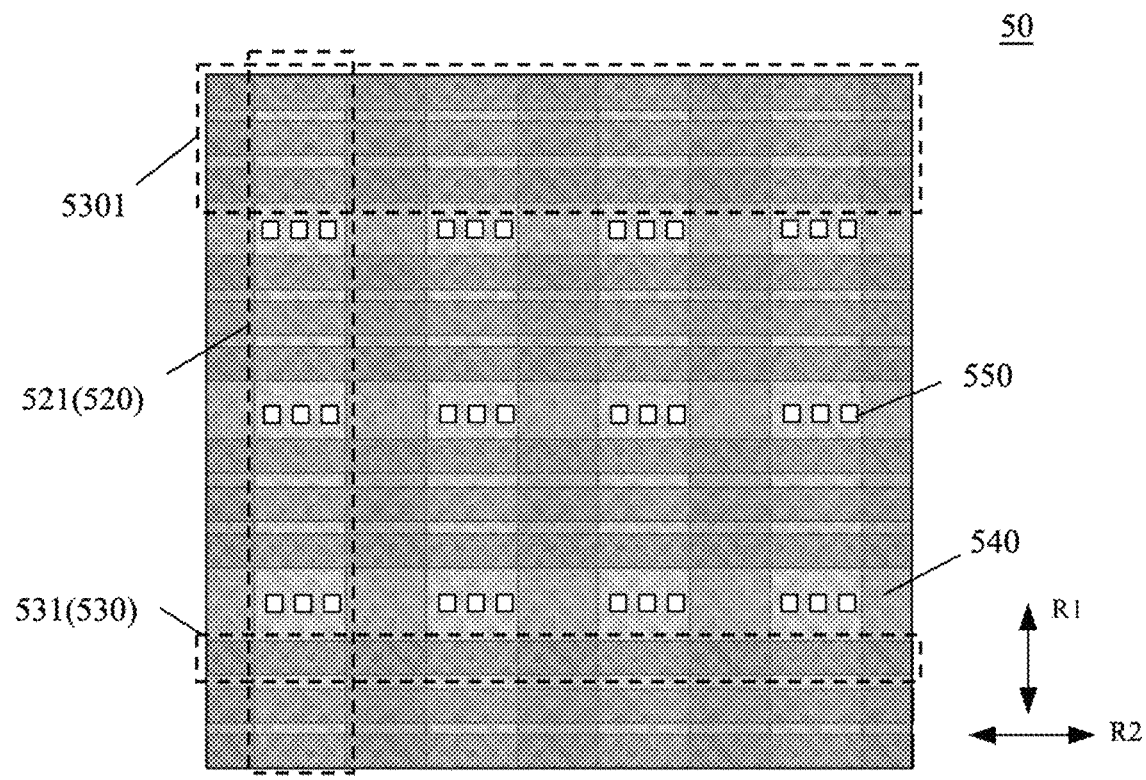
FIG. 6 is a schematic diagram of a partial planar structure in an opening peripheral region of another display substrate provided by some embodiments of the present disclosure.

FIG. 6 is a schematic diagram of a partial planar structure in an opening peripheral region of another display substrate provided by some embodiments of the present disclosure. For example, FIG. 6 may be a schematic diagram of an arrangement of a plurality of via holes in the opening peripheral region of the display substrate. It should be noted that, for ease of description, FIG. 6 only shows the arrangement relationship of the semiconductor pattern 520, the first conductive pattern 530, and the second conductive pattern 540, the design of other structures or functional layers in the display substrate 50 may refer to conventional setting methods in the art, and details are not described herein. For example, other structures of the display substrate 50 illustrated in FIG. 6 except for the first conductive patterns 530 and the arrangement of the via holes 550 are substantially the same as or similar to those of the display substrate 20 illustrated in FIG. 2A to FIG. 2C, and details are not described herein.

For example, as illustrated in FIG. 6, the first conductive pattern 530 includes a plurality of first wire groups 5301 arranged side by side along the first direction R1, and each first wire group 5301 includes three first wires 531 arranged side by side along the first direction R1. The plurality of via holes 550 are located between adjacent first wire groups 5301 in the first direction R1. Thus, by arranging the plurality of via holes 550 at intervals of three first wires 531 in the first direction R1, the arrangement density of the via holes 550 in the opening peripheral region can be reduced, and the entire size occupied by the plurality of first wires 531 in the plurality of first wire groups 5301 in the first direction R1 can be reduced, so that by optimizing the arrangement of the via holes 550 in the opening peripheral region, the semiconductor pattern 520 and the second conductive pattern 540 may be respectively used to form capacitors with the first wires 531, so as to achieve compensation for the electrical signal transmitting effect while reducing the size occupied by the opening peripheral region in the first direction R1, thereby facilitating achieving the narrow frame design of the display substrate 50.

It should be noted that the arrangement of the plurality of via holes 550 between adjacent first wire groups 5301 may refer to the corresponding descriptions in the above embodiments of the display substrate 20, and details are not described herein.

For example, in the display substrate 50 provided by the embodiments of the present disclosure, a row of via holes 550 arranged along the extending direction (for example, the second direction R2) of the first wire 531 are provided between adjacent first wire groups 5301 in the first direction R1. In some other embodiments of the present disclosure, such as two, three, or more rows of via holes 550 arranged along the extending direction of the first wire 531 may be provided between adjacent first wire groups 5301 in the first direction R1, that is, the plurality of via holes 550 may be arranged in an array between adjacent first wire groups 5301, and the embodiments of the present disclosure are not limited in this aspect.

It should be noted that, in some other embodiments of the present disclosure, each first wire group of the first conductive pattern of the display substrate may also include more first wires arranged side by side along the first direction R1. For example, each first wire group may also include four, five, or more first wires arranged side by side along the first direction R1, and the embodiments of the present disclosure are not limited in this aspect.

For example, in some embodiments of the present disclosure, the display substrate further includes a plurality of pixel units located in the display region. The pixel unit includes a pixel driving circuit located on the base substrate, and the pixel driving circuit includes a thin film transistor and a storage capacitor. The thin film transistor includes a gate electrode, an active layer, a source electrode, and a drain electrode, and the storage capacitor includes a first capacitor electrode and a second capacitor electrode opposite to the first capacitor electrode. The semiconductor pattern is arranged in the same layer as the active layer, the second conductive pattern is arranged in the same layer as the source electrode and the drain electrode, and the first conductive pattern is arranged in the same layer as at least one of a group consisting of the second capacitor electrode, the gate electrode, and the first capacitor electrode. Therefore, the manufacturing process of the display substrate can be simplified, and the manufacturing cost of the display substrate can be reduced.

For example, in the display substrate provided by some embodiments of the present disclosure, the gate electrode and the first capacitor electrode may be provided in the identical layer, and the second capacitor electrode and the first conductive pattern may be provided in the identical layer. Alternatively, the first conductive pattern may be provided in the same layer as the gate electrode and the first capacitor electrode. Alternatively, a part of the first conductive pattern may be provided in the same layer as the second capacitor electrode, and the other part of the first conductive pattern is provided in the same layer as the gate electrode and the first capacitor electrode, that is, the first conductive pattern includes two parts alternately formed, and the embodiments of the present disclosure are not limited in this aspect.

It should be noted that in the embodiments of the present disclosure, "provided/arranged in the same layer or in the identical layer" means that two functional layers or structural layers are formed in the same layer or in the identical layer and made of the same material in the layer structure of the display substrate, that is, in the manufacturing process, the two functional layers or structural layers may be formed by the same material layer, and the required pattern and structure may be formed by the same patterning process. For example, the material layer may be formed first, and the patterning process is performed on the material layer to form the required pattern and structure.

For example, in some embodiments of the present disclosure, the first wires in the plurality of first wire groups of the first conductive pattern are configured to transmit scanning signals for the pixel driving circuits, respectively.

For example, in the case where the first wire is formed in the same layer as the signal line used to transmit the scanning signal of the pixel driving circuit in the display region, the first wire may be connected to the signal line in the same layer to achieve signal transmission; or in the case where the first wire is in the different layer from the signal line used to transmit the scanning signal of the pixel driving circuit in the display region, the first wire may be electrically connected to the signal line through, for example, a via hole structure to achieve signal transmission. The embodiments of the present disclosure are not limited in this aspect.

For example, in some embodiments of the present disclosure, the pixel unit further includes a light-emitting component, the light-emitting component is on a side of the pixel driving circuit away from the base substrate and is electrically connected to the pixel driving circuit. The pixel driving circuit is configured to drive the light-emitting component to work.

In the following, the cross-sectional structure of the display substrate 40 in the opening peripheral region 403 illustrated in FIG. 5A and FIG. 5B is taken as an example to describe the display region of the display substrate provided by the embodiments of the present disclosure.

Figure 7A:
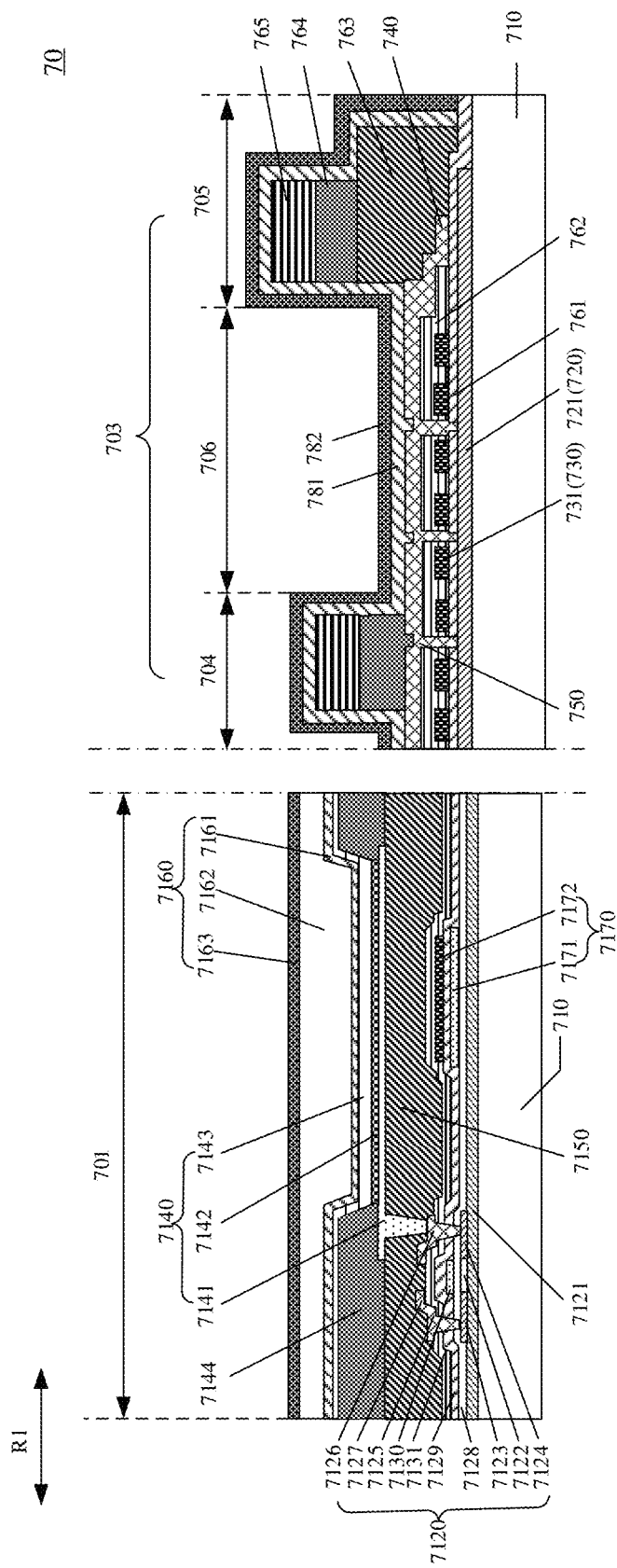
FIG. 7A is a schematic diagram of a partial cross-sectional structure of a display substrate provided by some embodiments of the present disclosure.
Figure 7B:
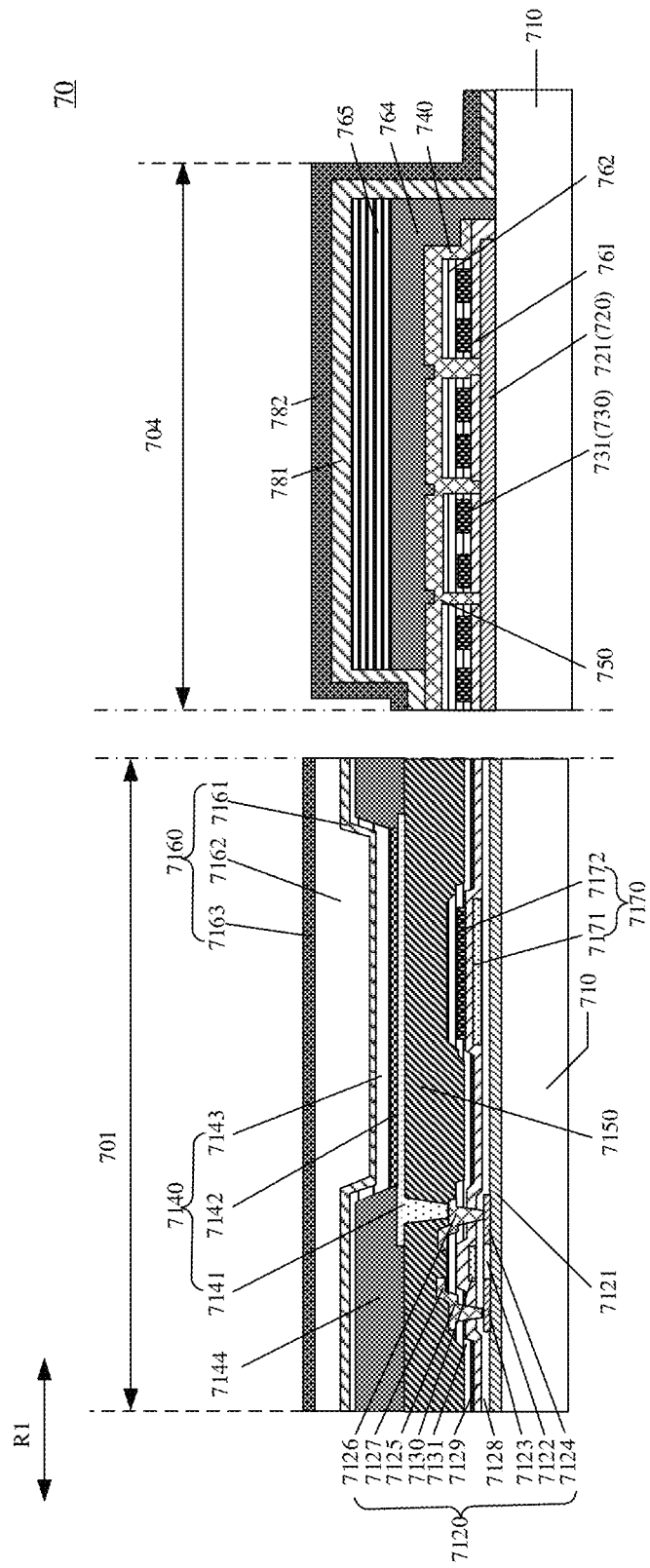
FIG. 7B is a schematic diagram of a partial cross-sectional structure of another display substrate provided by some embodiments of the present disclosure.

FIG. 7A is a schematic diagram of a partial cross-sectional structure of a display substrate provided by some embodiments of the present disclosure, and FIG. 7B is a schematic diagram of a partial cross-sectional structure of another display substrate provided by some embodiments of the present disclosure. For example, the portion of the opening peripheral region 703 of the display substrate 70 illustrated in FIG. 7A and FIG. 7B is substantially the same as or similar to the portion of the opening peripheral region 403 of the display substrate 40 illustrated in FIG. 5A and FIG. 5B, and details are not described herein.

It should be noted that portions of the display region 701 of the display substrate 70 are substantially the same or similar in the embodiments illustrated in FIG. 7A and FIG. 7B. In the following, the structure illustrated in FIG. 7A is taken as an example to describe the display substrate 70. The structure illustrated in FIG. 7B may refer to the corresponding descriptions of FIG. 7A, and details are not described herein.

For example, as illustrated in FIG. 7A, the display substrate 70 further includes pixel units located in the display region 701 for achieving functions such as light emission driving, light emission control, etc. The pixel unit includes the pixel driving circuit 7120, the first planarization layer 7150, and the light-emitting component 7140 on the base substrate 710.

For example, the pixel driving circuits 7120 in the plurality of rows of pixel units located on the left side and right side of the opening in the display region 701 may be electrically connected through the first conductive pattern 730 (for example, the plurality of first wires 731 in the first conductive pattern 730), so as to transmit one or more electrical signals for the pixel driving circuits 7120, such as a gate scanning signal, a light-emitting control signal, a reset signal, etc.

For example, one first wire 731 may be provided corresponding to each row of pixel driving circuits 7120 located on the left side and right side of the opening in the display region 701 to transmit one of the above electrical signals. For example, gate lines of each row of pixel driving circuits 7120 on the left side and right side of the opening in the display region 701 are electrically connected through the first wire 731, so as to transmit a gate scanning signal. Multiple first wires 731 may also be provided corresponding to each row of pixel driving circuits 7120 on the left side and right side of the opening in the display region 701 to respectively transmit the above various electrical signals. For example, the gate lines and the light-emitting control lines of each row of pixel driving circuits 7120 on the left side and right side of the opening in the display region 701 are electrically connected through the first wires 731, respectively, so as to respectively transmit a gate scanning signal and a light-emitting control signal, and the embodiments of the present disclosure are not limited in this aspect.

For example, by providing the semiconductor pattern 720 (for example, the plurality of conductive blocks 721 in the semiconductor pattern 720) under the first conductive pattern 730, capacitors can be formed between the plurality of conductive blocks 721 and the plurality of first wires 731, thereby increasing the transmitting loads of the first wires 731 to compensate for the electrical signal transmitting effect of the first wires 731. Therefore, the display effect of the pixel units located on the left side and right side of the opening in the display region 701 can be kept consistent with the display effect of other pixel units in the display region 701, thereby avoiding or reducing the display abnormality of the image in different gray levels, and improving the image display effect of the display substrate 70.

For example, the semiconductor pattern 720 is electrically connected to the second conductive pattern 740 through the via hole 750 and is further electrically connected to the power wire pattern (not shown). For example, the power wire pattern may be configured to receive a low voltage signal (for example, a cathode signal or a ground signal provided to the light-emitting component 7140), or may be configured to receive a high voltage signal, so that the second conductive pattern 740 and the plurality of conductive blocks 721 of the semiconductor pattern 720 are applied with the corresponding electrical signal, and the first wire 731 which transmits electrical signals such as the gate scanning signal or the like can form capacitors with the conductive blocks 721 and the second conductive pattern 740, respectively, so as to achieve the compensation effect.

For example, in the embodiments illustrated in FIG. 7A and FIG. 7B, the power wire pattern may be in the display region 701 and provided in the same layer as the second conductive pattern 740, so that the second conductive pattern 740 may be connected to the power wire pattern in the same layer to receive the corresponding electrical signal.

In the following, the embodiments of the present disclosure take the case where one first wire 731 is provided for each row of pixel driving circuits 7120 located on the left side and right side of the opening in the display region 701 to transmit a gate scanning signal (that is, gate lines of each row of pixel driving circuits 7120 on the left side and right side of the opening in the display region 701 are electrically connected through the first wire 731 to transmit a gate scanning signal) as an example to describe the display substrate 70 with reference to the specific structure of the pixel driving circuit 7120.

Figure 8:
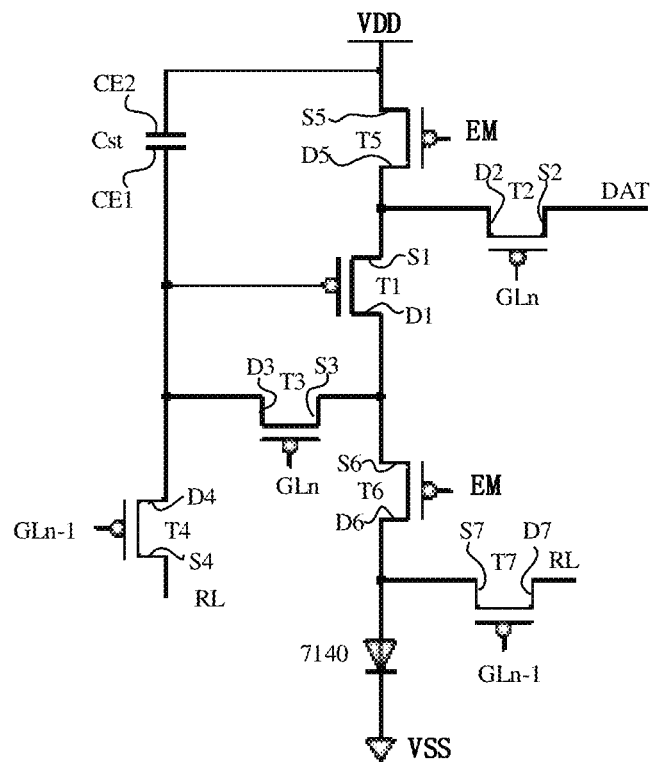
FIG. 8 is an equivalent circuit diagram of a pixel driving circuit in a display substrate provided by some embodiments of the present disclosure.
Figure 9A:
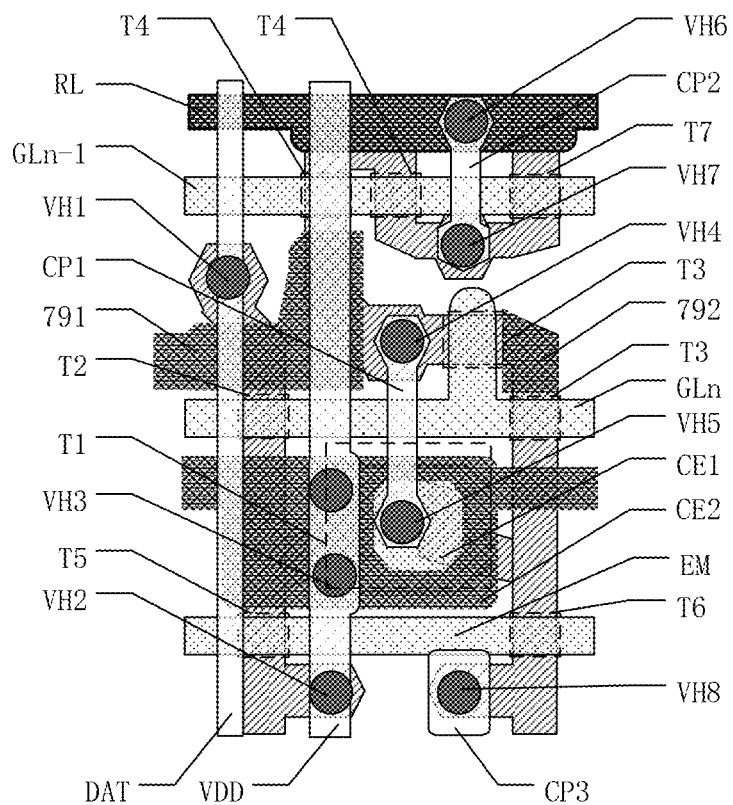
FIG. 9A to FIG. 9E are schematic diagrams of respective layers of a pixel driving circuit in a display substrate provided by some embodiments of the present disclosure.

FIG. 8 is an equivalent circuit diagram of a pixel driving circuit in a display substrate provided by some embodiments of the present disclosure, and FIG. 9A to FIG. 9E are schematic diagrams of respective layers of a pixel driving circuit in a display substrate provided by some embodiments of the present disclosure. For example, FIG. 7A and FIG. 7B are schematic diagrams of the partial cross-sectional structure of the display substrate 70 including the pixel driving circuit 7120 illustrated in FIG. 8 and FIG. 9A. It should be noted that the specific structure of the pixel driving circuit 7120 illustrated in FIG. 8 and FIG. 9A is only an exemplary description, and the embodiments of the present disclosure include but are not limited to this.

In some embodiments, as illustrated in FIG. 8, the pixel driving circuit 7120 includes a plurality of thin film transistors T1, T2, T3, T4, T5, T6, and T7, a plurality of signal lines connected to the plurality of thin film transistors T1, T2, T3, T4, T5, T6, and T7, and a storage capacitor Cst. The plurality of signal lines include a gate line GL, a light-emitting control line EM, an initialization line RL, a data line DAT, and a first power line VDD. The gate line GL may include a first gate line GLn and a second gate line GLn-1. For example, the first gate line GLn may be used to transmit a gate scanning signal, and the second gate line GLn-1 may be used to transmit a reset signal. The light-emitting control line EM may be used to transmit a light-emitting control signal. Thus, the pixel driving circuit 7120 is a 7T1C (seven transistors and one capacitor) pixel driving circuit.

It should be noted that the embodiments of the present disclosure include but are not limited thereto. The pixel driving circuit 7120 may also adopt other types of circuit structures, such as a 7T2C (seven transistors and two capacitors) structure, a 9T2C (nine transistors and two capacitors) structure, or the like, which is not limited by the embodiments of the present disclosure.

For example, the first gate lines GLn of each row of pixel driving circuits 7120 located on the left side and right side of the opening in the display region 701 may be electrically connected through the first wire 731 to transmit the gate scanning signal, thereby achieving the compensation effect of the gate scanning signal.

For example, because the first wire 731 and the first gate line GLn are located in different layers with respect to the base substrate 710, the first wire 731 may be electrically connected to the first gate line GLn through such as a via hole structure (for example, a method for connecting lines in different layers) or the like to transmit the corresponding gate scanning signal.

For example, as illustrated in FIG. 8, a first gate electrode G1 of the first thin film transistor T1 is electrically connected to a third drain electrode D3 of the third thin film transistor T3 and a fourth drain electrode D4 of the fourth thin film transistor T4. A first source electrode S1 of the first thin film transistor T1 is electrically connected to a second drain electrode D2 of the second thin film transistor T2 and a fifth drain electrode D5 of the fifth thin film transistor T5. A first drain electrode D1 of the first thin film transistor T1 is electrically connected to a third source electrode S3 of the third thin film transistor T3 and a sixth source electrode S6 of the sixth thin film transistor T6.

For example, as illustrated in FIG. 8, a second gate electrode G2 of the second thin film transistor T2 is configured to be electrically connected to the first gate line GLn to receive the gate scanning signal, a second source electrode S2 of the second thin film transistor T2 is configured to be electrically connected to the data line DAT to receive the data signal, and the second drain electrode D2 of the second thin film transistor T2 is electrically connected to the first source electrode S1 of the first thin film transistor T1.

For example, as illustrated in FIG. 8, a third gate electrode G3 of the third thin film transistor T3 is configured to be electrically connected to the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as illustrated in FIG. 8, a fourth gate electrode G4 of the fourth thin film transistor T4 is configured to be electrically connected to the second gate line GLn-1 to receive the reset signal, a fourth source electrode S4 of the fourth thin film transistor T4 is configured to be electrically connected to the initialization line RL to receive the initialization signal, and the fourth drain electrode D4 of the fourth thin film transistor T4 is electrically connected to the first gate electrode G1 of the first thin film transistor T1.

For example, as illustrated in FIG. 8, a fifth gate electrode G5 of the fifth thin film transistor T5 is configured to be electrically connected to the light-emitting control line EM to receive the light-emitting control signal, a fifth source electrode S5 of the fifth thin film transistor T5 is configured to be electrically connected to the first power line VDD to receive the first power signal, and the fifth drain electrode D5 of the fifth thin film transistor T5 is electrically connected to the first source electrode S1 of the first thin film transistor T1.

For example, as illustrated in FIG. 8, a sixth gate electrode G6 of the sixth thin film transistor T6 is configured to be electrically connected to the light-emitting control line EM to receive the light-emitting control signal, the sixth source electrode S6 of the sixth thin film transistor T6 is electrically connected to the first drain electrode D1 of the first thin film transistor T1, and a sixth drain electrode D6 of the sixth thin film transistor T6 is electrically connected to a first display electrode (for example, an anode) of the light-emitting component 7140.

For example, as illustrated in FIG. 8, a seventh gate electrode G7 of the seventh thin film transistor T7 is configured to be electrically connected to the second gate line GLn-1 to receive the reset signal, a seventh source electrode S7 of the seventh thin film transistor T7 is electrically connected to the first display electrode (for example, the anode) of the light-emitting component 7140, and a seventh drain electrode D7 of the seventh thin film transistor T7 is configured to be electrically connected to the initialization line RL to receive the initialization signal. For example, the seventh drain electrode D7 of the seventh thin film transistor T7 may be electrically connected to the initialization line RL by being connected to the fourth source electrode S4 of the fourth thin film transistor T4.

For example, as illustrated in FIG. 8, the storage capacitor Cst includes a first capacitor electrode CE1 and a second capacitor electrode CE2. The second capacitor electrode CE2 is electrically connected to the first power line VDD, and the first capacitor electrode CE1 is electrically connected to the first gate electrode G1 of the first thin film transistor T1 and the third drain electrode D3 of the third thin film transistor T3.

For example, as illustrated in FIG. 8, a second display electrode (for example, a cathode) of the light-emitting component 7140 is electrically connected to the second power line VSS.

It should be noted that one of the first power line VDD and the second power line VSS is a power line that provides a high voltage, and the other is a power line that provides a low voltage. In the embodiment illustrated in FIG. 8, the first power line VDD provides a constant first voltage, and the first voltage is a positive voltage; and the second power line VSS provides a constant second voltage, and the second voltage may be a negative voltage. For example, in some examples, the second voltage may be a ground voltage.

For example, the power wire pattern may include the first power line VDD and/or the second power line VSS described above, or may also be configured to be electrically connected to the first power line VDD and/or the second power line VSS. The embodiments of the present disclosure are not limited in this aspect.

Figure 10:
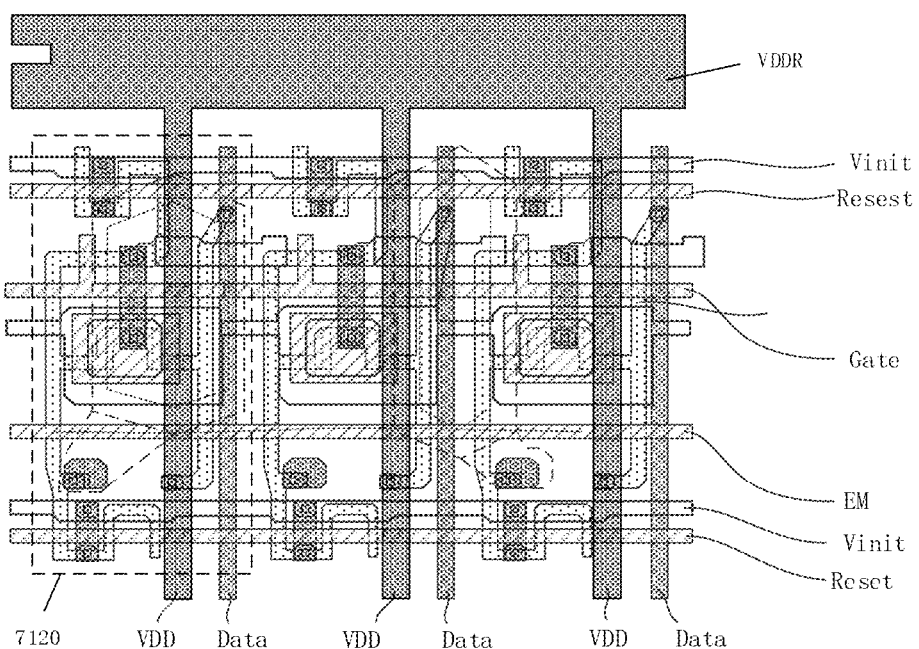
FIG. 10 is a schematic diagram of respective layers of a pixel driving circuit in another display substrate provided by some embodiments of the present disclosure.

For example, as illustrated in FIG. 10, first power lines VDD in the plurality of pixel driving circuits 7120 may be connected to each other. For example, in the extending direction of the first power lines VDD, the plurality of first power lines VDD are connected to each other to form a continuous portion VDDR which can transmit the electrical signal, so as to form one electrode of the capacitor, thereby not only facilitating the storage of the electrical signal, but also reducing the voltage drop of the electrical signal during transmission.

It should be noted that the layers of the pixel driving circuit 7120 illustrated in FIG. 10 are substantially the same as or similar to the layers of the pixel driving circuit 7120 illustrated in FIG. 9A, details may refer to the corresponding descriptions in the embodiment as illustrated in FIG. 9A, and details are not described herein.

It should be noted that, for clarity and conciseness, only three pixel driving circuits 7120 are illustrated in FIG. 10 to describe the connection relationship of the plurality of first power lines VDD in the plurality of pixel driving circuits 7120, but this does not constitute a limitation of the present disclosure.

It should be noted that the above reset signal and the above initialization signal may be the same signal.

For example, the power wire pattern of the display substrate 70 may be configured to provide the above first voltage or second voltage, so that the second conductive pattern 740 electrically connected to the power wire pattern and the semiconductor pattern 720 electrically connected to the second conductive pattern 740 are applied with the first voltage or the second voltage, thereby enabling the first wire 731, which is electrically connected to the first gate line GLn and transmits the gate scanning signal, to form capacitors with the second conductive pattern 740 and the conductive blocks 721 of the semiconductor pattern 720, respectively, so as to achieve the compensation effect.

It should be noted that according to the characteristics of transistors, transistors may be divided into N-type transistors and P-type transistors. For the sake of clarity, the embodiments of the present disclosure take the transistors being P-type transistors (for example, P-type MOS transistors) as an example to illustrate the technical solutions of the present disclosure in detail, that is, in the descriptions of the present disclosure, the first transistor T1, the second transistor T2, the third transistor T3, the fourth transistor T4, the fifth transistor T5, the sixth transistor T6, the seventh transistor T7, and the like may all be P-type transistors. However, the transistors in the embodiments of the present disclosure are not limited to P-type transistors. Those skilled in the art may also use N-type transistors (for example, N-type MOS transistors) to implement the functions of one or more transistors in the embodiments of the present disclosure according to actual needs.

It should be noted that the transistors used in the embodiments of the present disclosure may be thin film transistors or field effect transistors, or may be other switching devices or components with the same characteristics. The thin film transistor may include an oxide semiconductor thin film transistor, an amorphous silicon thin film transistor, a polysilicon thin film transistor, or the like. The source electrode and drain electrode of the transistor are symmetrical in structure, so the source electrode and drain electrode are indistinguishable in physical structure. In the embodiments of the present disclosure, the source electrode and drain electrode of all or part of the transistors are interchangeable as required.

In some embodiments, as illustrated in FIG. 9A, the pixel driving circuit 7120 includes the above thin film transistors T1, T2, T3, T4, T5, T6, and T7, the storage capacitor Cst, and the first gate line GLn, the second gate line GLn-1, the light-emitting control line EM, the initialization line RL, the data line DAT, and the first power line VDD which are connected to the plurality of thin film transistors T1, T2, T3, T4, T5, T6, and T7. In the following, the structure of the pixel driving circuit 7120 is described with reference to FIG. 8 and FIG. 9A to FIG. 9E.

For example, FIG. 9A is a schematic diagram of a stacked position relationship of the semiconductor layer, the first conductive layer, the second conductive layer, and the third conductive layer of the pixel driving circuit 7120.

Figure 9B:
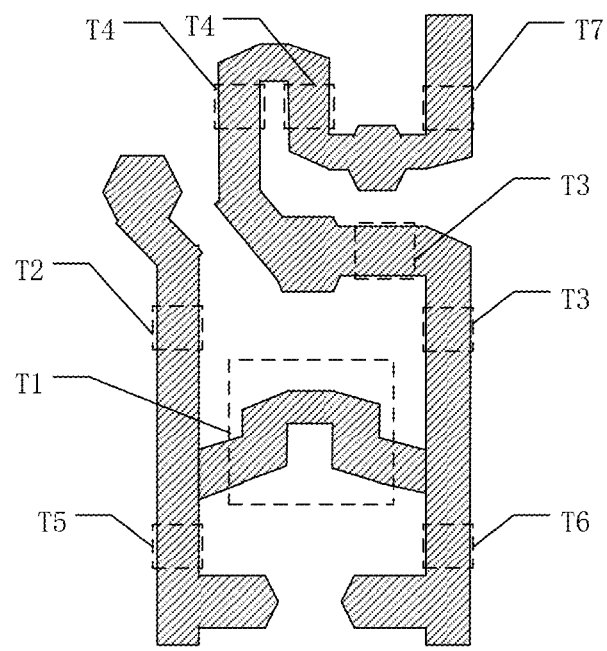

FIG. 9B shows the semiconductor layer of the pixel driving circuit 7120. For example, the semiconductor layer illustrated in FIG. 9B may be the active layer 7122 illustrated in FIG. 8. As illustrated in FIG. 9B, the semiconductor layer may be formed by patterning a semiconductor material. The semiconductor layer may be used to form the active layers of the first thin film transistor T1, the second thin film transistor T2, the third thin film transistor T3, the fourth thin film transistor T4, the fifth thin film transistor T5, the sixth thin film transistor T6, and the seventh thin film transistor T7 described above. Each active layer may include a source region, a drain region, and a channel region between the source region and the drain region. For example, the semiconductor layer may be made of amorphous silicon, polysilicon, oxide semiconductor materials, or the like. It should be noted that the above source region and drain region may be regions doped with n-type impurities or p-type impurities.

In the display substrate provided by some embodiments of the present disclosure, a gate insulating layer (for example, the gate insulating layer 7128 illustrated in FIG. 7A and FIG. 7B, but not illustrated in FIG. 9A to FIG. 9E) is formed on the above semiconductor layer to protect the above semiconductor layer.

Figure 9C:
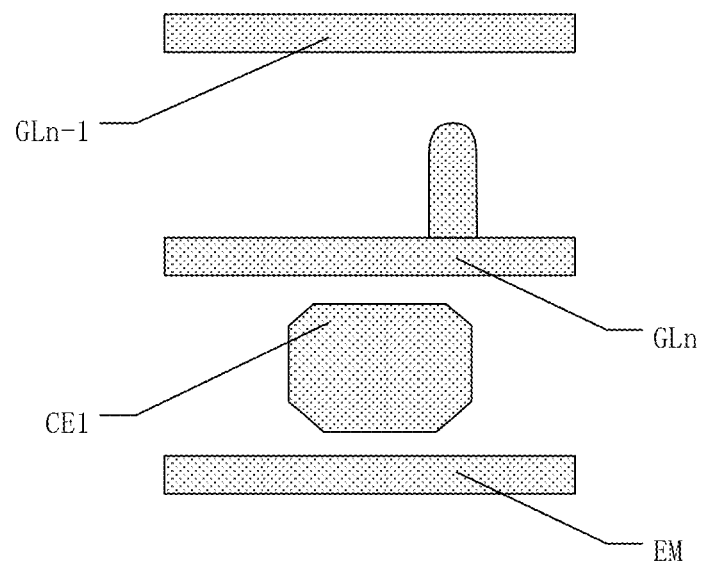

FIG. 9C shows the first conductive layer of the pixel driving circuit 7120. For example, as illustrated in FIG. 9C, the first conductive layer of the pixel driving circuit 7120 is provided on the gate insulating layer, so as to be insulated from the semiconductor layer illustrated in FIG. 9B. The first conductive layer may include the first capacitor electrode CE1 of the storage capacitor Cst, the first gate line GLn, the second gate line GLn-1, the light-emitting control line EM, and the gate electrodes of the first thin film transistor T1, the second thin film transistor T2, the third thin film transistor T3, the fourth thin film transistor T4, the fifth thin film transistor T5, the sixth thin film transistor T6, and the seventh thin film transistor T7 (for example, the first gate electrode G1, the second gate electrode G2, the third gate electrode G3, the fourth gate electrode G4, the fifth gate electrode G5, the sixth gate electrode G6, and the seventh gate electrode G7 described above). As illustrated in FIG. 9C, the gate electrodes of the second thin film transistor T2, the fourth thin film transistor T4, the fifth thin film transistor T5, the sixth thin film transistor T6, and the seventh thin film transistor T7 are portions, which overlap with the semiconductor layer, of the first gate line GLn and the second gate line GLn-1. The third thin film transistor T3 may be a thin film transistor with a double gate structure, one gate electrode of the third thin film transistor T3 may be a portion, which overlaps with the semiconductor layer, of the first gate line GLn, and the other gate electrode of the third thin film transistor T3 may be a protrusion portion protruding from the first gate line GLn. The gate electrode of the first thin film transistor T1 may be the first capacitor electrode CE1. The fourth thin film transistor T4 may be a thin film transistor with a double gate structure, and the two gate electrodes are portions, which overlap with the semiconductor layer, of the second gate line GLn-1, respectively.

In the display substrate provided by some embodiments of the present disclosure, a first interlayer insulating layer (for example, the first interlayer insulating layer 7129 illustrated in FIG. 7A and FIG. 7B, but not illustrated in FIG. 9A to FIG. 9E) is formed on the first conductive layer described above to protect the first conductive layer.

Figure 9D:
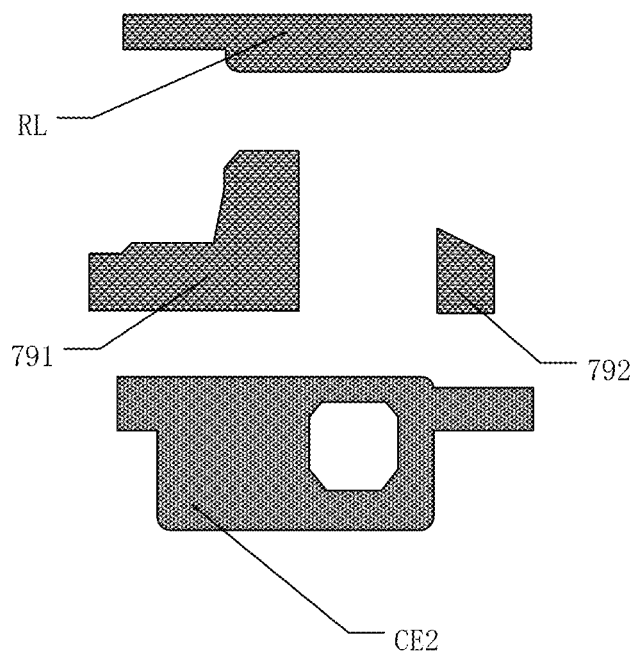

FIG. 9D shows the second conductive layer of the pixel driving circuit 7120. For example, as illustrated in FIG. 9D, the second conductive layer of the pixel driving circuit 7120 includes the second capacitor electrode CE2 of the storage capacitor Cst and the initialization line RL. The second capacitor electrode CE2 at least partially overlaps with the first capacitor electrode CE1 to form the storage capacitor Cst.

In some embodiments, the second conductive layer may further include a first light shielding portion 791 and a second light shielding portion 792. An orthographic projection of the first light shielding portion 791 on the base substrate 710 covers the active layer of the second thin film transistor T2, and covers the active layer between the drain electrode of the third thin film transistor T3 and the drain electrode of the fourth thin film transistor T4, thereby preventing external light from affecting the active layers of the second thin film transistor T2, the third thin film transistor T3, and the fourth thin film transistor T4. An orthographic projection of the second light shielding portion 792 on the base substrate 710 covers the active layer between the two gate electrodes of the third thin film transistor T3, thereby preventing external light from affecting the active layer of the third thin film transistor T3. The first light shielding portion 791 may be an integral structure with the second light shielding portion 792 of the adjacent pixel driving circuit, and may be electrically connected to the first power line VDD through a via hole penetrating the second interlayer insulating layer.

In the display substrate provided by some embodiments of the present disclosure, a second interlayer insulating layer (for example, the second interlayer insulating layer 7131 illustrated in FIG. 7A and FIG. 7B, but not illustrated in FIG. 9A to FIG. 9E) is formed on the second conductive layer described above to protect the second conductive layer.

Figure 9E:
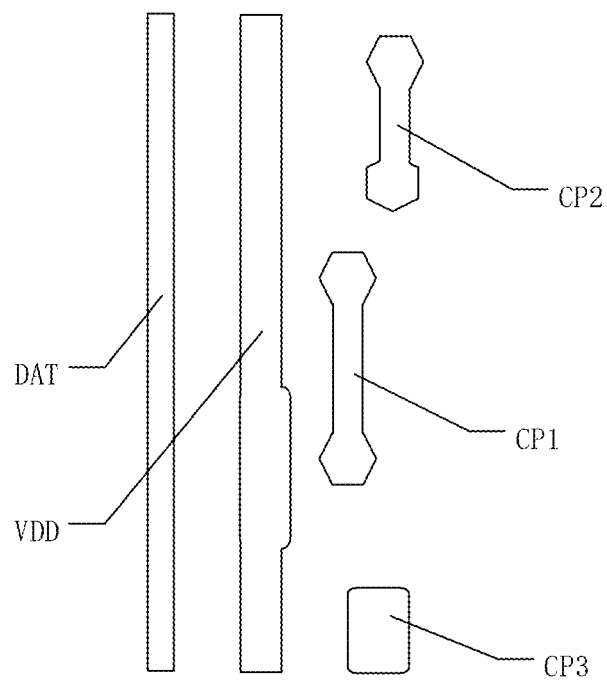

FIG. 9E shows the third conductive layer of the pixel driving circuit 7120. For example, as illustrated in FIG. 9E, the third conductive layer of the pixel driving circuit 7120 includes the data line DAT and the first power line VDD. As illustrated in FIG. 9A and FIG. 9E, the data line DAT is connected to the source region of the second thin film transistor T2 in the semiconductor layer through at least one via hole (for example, a via hole VH1) in the gate insulating layer, the first interlayer insulating layer, and the second interlayer insulating layer. The first power line VDD is connected to the source region of the fifth thin film transistor T5 in the semiconductor layer through at least one via hole (for example, a via hole VH2) in the gate insulating layer, the first interlayer insulating layer, and the second interlayer insulating layer. The first power line VDD is connected to the second capacitor electrode CE2 in the second conductive layer through at least one via hole (for example, a via hole VH3) in the second interlayer insulating layer.

For example, the third conductive layer further includes a first connection portion CP1, a second connection portion CP2, and a third connection portion CP3. One end of the first connection portion CP1 is connected to the drain region of the third thin film transistor T3 in the semiconductor layer through at least one via hole (for example, a via hole VH4) in the gate insulating layer, the first interlayer insulating layer, and the second interlayer insulating layer, and the other end of the first connection portion CP1 is connected to the gate electrode of the first thin film transistor T1 in the first conductive layer through at least one via hole (for example, a via hole VH5) in the first interlayer insulating layer and the second interlayer insulating layer. One end of the second connection portion CP2 is connected to the initialization line RL through a via hole (for example, a via hole VH6) in the second interlayer insulating layer, and the other end of the second connection portion CP2 is connected to the source region of the seventh thin film transistor T7 and the source region of the fourth thin film transistor T4 in the semiconductor layer through at least one via hole (for example, a via hole VH7) in the gate insulating layer, the first interlayer insulating layer, and the second interlayer insulating layer. The third connection portion CP3 is connected to the drain region of the sixth thin film transistor T6 in the semiconductor layer through at least one via hole (for example, a via hole VH8) in the gate insulating layer, the first interlayer insulating layer, and the second interlayer insulating layer.

In the display substrate provided by some embodiments of the present disclosure, a protection layer (for example, the first planarization layer 7150 illustrated in FIG. 7A and FIG. 7B, but not illustrated in FIG. 9A to FIG. 9E) is formed on the third conductive layer described above to protect the third conductive layer. The first display electrode (for example, the anode) of the light-emitting component 7140 in the pixel unit may be disposed on the protection layer.

For example, the first wire 731 in the first conductive pattern 730 may be provided in the same layer as the second capacitor electrode CE2 in the second conductive layer, and the first wire 731 may be connected to the first gate line GLn in the first conductive layer through at least one via hole in the first interlayer insulating layer.

For example, in combination with the pixel driving circuit 7120 illustrated in FIG. 8 and FIG. 9A, FIG. 7A and FIG. 7B are schematic diagrams of a partial cross-sectional structure of the display substrate 70 including the pixel driving circuit 7120 illustrated in FIG. 8 and FIG. 9A.

In some embodiments, as illustrated in FIG. 7A and FIG. 7B, the pixel unit further includes a buffer layer 7121 on the base substrate 710, and the pixel driving circuit 7120 may include an active layer 7122 (for example, the semiconductor layer of the pixel driving circuit 7120 illustrated in FIG. 9B) on the buffer layer 7121, a gate insulating layer 7128 on a side of the active layer 7122 away from the base substrate 710, a gate electrode 7130 (for example, the first conductive layer of the pixel driving circuit 7120 illustrated in FIG. 9C) on the gate insulating layer 7128, a first interlayer insulating layer 7129 on a side of the gate electrode 7130 away from the base substrate 710, a second interlayer insulating layer 7131 on the first interlayer insulating layer 7129, and a source electrode 7125 and a drain electrode 7126 on the second interlayer insulating layer 7131.

For example, the semiconductor pattern 720 (for example, the plurality of conductive blocks 721 in the semiconductor pattern 720) may be provided in the same layer as the active layer 7122. For example, the first insulating layer 761 may be provided in the same layer as the first interlayer insulating layer 7129, and the second insulating layer 762 may be provided in the same layer as the second interlayer insulating layer 7131. For example, the source electrode 7125 and the drain electrode 7126 may be provided in the same layer as the second conductive pattern 740. For example, the above structures or functional layers provided in the identical layer may be formed in the identical layer in the manufacturing process, for example, formed by the same material layer through a patterning process, thereby simplifying the manufacturing process of the display substrate 70 and reducing the manufacturing cost of the display substrate 70.

For example, the buffer layer 7121 serves as a transition layer, which may prevent harmful substances in the base substrate 710 from entering the inside of the display substrate 710, and further may increase the adhesion of the film layer in the display substrate 710 on the base substrate 710. For example, the material of the buffer layer 7121 may include an insulating material such as silicon oxide, silicon nitride, silicon oxynitride, etc. For example, the material of one or more of a group consisting of the first interlayer insulating layer 7129, the second interlayer insulating layer 7131, and the gate insulating layer 7128 may include an insulating material such as silicon oxide, silicon nitride, silicon oxynitride, or the like. The materials of the first interlayer insulating layer 7129, the second interlayer insulating layer 7131, and the gate insulating layer 7128 may be the same or different from each other, and the embodiments of the present disclosure are not limited in this aspect.

For example, as illustrated in FIG. 7A and FIG. 7B, the active layer 7122 may include a source region 7123, a drain region 7124, and a channel region between the source region 7123 and the drain region 7124. The first interlayer insulating layer 7129, the second interlayer insulating layer 7131, and the gate insulating layer 7128 have via holes to expose the source region 7123 and the drain region 7124. The source electrode 7125 and the drain electrode 7126 are electrically connected to the source region 7123 and the drain region 7124 through the via holes, respectively. The gate electrode 7130 overlaps with the channel region between the source region 7123 and the drain region 7124 in the active layer 7122 in the direction perpendicular to the base substrate 710.

For example, the first planarization layer 7150 is located above the source electrode 7125 and the drain electrode 7126 for planarizing the surface of the pixel driving circuit 7120 away from the base substrate 710. The first planarization layer 7150 may planarize the uneven surface caused by the pixel driving circuit 7120 and thus may prevent the irregularities caused by the pixel driving circuit 7120 from causing defects in the light-emitting component 7140.

For example, the first planarization layer 7150 may be provided in the same layer as the third insulating layer 763 in the opening peripheral region 703. Therefore, the first planarization layer 7150 and the third insulating layer 763 may be formed in the same layer in the manufacturing process, for example, formed by the same material layer through a patterning process.

For example, the material of the active layer 7122 may include polysilicon or oxide semiconductors (for example, indium gallium zinc oxide). The material of the gate electrode 7130 may include a metal material or an alloy material, such as a metal single-layer or multi-layer structure formed by molybdenum, aluminum, titanium, etc. For example, the multi-layer structure is a stacked layer of multiple metal layers (such as a stacked layer of three metal layers of an aluminum layer, a titanium layer, and an aluminum layer (Al/Ti/Al)). The material of the source electrode 7125 and the drain electrode 7126 may include a metal material or an alloy material, such as a metal single-layer or multi-layer structure formed by molybdenum, aluminum, titanium, etc. For example, the multi-layer structure is a stacked layer of multiple metal layers (such as a stacked layer of three metal layers of an aluminum layer, a titanium layer, and an aluminum layer (Al/Ti/Al)). The embodiments of the present disclosure do not specifically limit the material of each structure or functional layer.

For example, as illustrated in FIG. 7A and FIG. 7B, the via hole is formed in the first planarization layer 7150 to expose the source electrode 7125 or the drain electrode 7126 (the drain electrode 7126 is exposed in FIG. 7A and FIG. 7B). A light-emitting component 7140 is formed on the first planarization layer 7150. The light-emitting component 7140 includes a first display electrode 7141 (for example, an anode), a light-emitting layer 7142, and a second display electrode 7143 (for example, a cathode). The first display electrode 7141 of the light-emitting component 7140 is electrically connected to the drain electrode 7126 through the via hole in the first planarization layer 7150. A pixel definition layer 7144 is formed on the first display electrode 7141, and the pixel definition layer 7144 includes a plurality of openings to define a plurality of pixel units. Each of the plurality of openings exposes the first display electrode 7141, and the light-emitting layer 7142 is disposed in the plurality of openings of the pixel definition layer 7144. For example, the second display electrode 7143 may be disposed in a part of the display region 701 or in the entire display region 701, so that the second display electrode 7143 may be formed on the entire surface during the manufacturing process.

For example, the first display electrode 7141 may be provided in the same layer as the power wire pattern. Therefore, the first display electrode 7141 and the power wire pattern may be formed in the identical layer in the manufacturing process, for example, formed by the identical material layer through a patterning process.

For example, the pixel definition layer 7144 may be provided in the same layer as the fourth insulating layer 764 in the opening peripheral region 703. Therefore, the pixel definition layer 7144 and the fourth insulating layer 764 may be formed in the same layer in the manufacturing process, for example, formed by the same material layer through a patterning process.

For example, the first display electrode 7141 may include a reflective layer, and the second display electrode 7143 may include a transparent layer or a semi-transparent layer. Therefore, the first display electrode 7141 may reflect light emitted from the light-emitting layer 7142, and this part of light may be emitted into the external environment through the second display electrode 7143, thereby providing a high light emission rate. In the case where the second display electrode 7143 includes a semi-transmission layer, part of light reflected by the first display electrode 7141 may be reflected again through the second display electrode 7143, so that the first display electrode 7141 and the second display electrode 7143 form a resonance structure, thereby improving the light emission efficiency.

For example, the material of the first display electrode 7141 may include at least one transparent conductive oxide material, which includes indium tin oxide (ITO), indium zinc oxide (IZO), zinc oxide (ZnO), and the like. In addition, the first display electrode 7141 may include a metal having high reflectivity as a reflective layer, such as silver (Ag).

For example, in the case where the display substrate 70 is an organic light-emitting diode (OLED) display substrate, the light-emitting layer 7142 may include a small-molecular organic material or a polymer-molecular organic material, may be a fluorescent light-emitting material or a phosphorescent light-emitting material, and may emit red light, green light, blue light, white light, or the like. Moreover, according to different actual needs, in different examples, the light-emitting layer 7142 may further include functional layers such as an electron injection layer, an electron transport layer, a hole injection layer, a hole transport layer, and the like.

In the case where the display substrate 70 is a quantum dot light-emitting diode (QLED) display substrate, the light-emitting layer 7142 may include a quantum dot material, such as the silicon quantum dot, germanium quantum dot, cadmium sulfide quantum dot, cadmium selenide quantum dot, cadmium telluride quantum dot, zinc selenide quantum dot, lead sulfide quantum dot, lead selenide quantum dot, indium phosphide quantum dot, indium arsenide quantum dot, etc. The particle size of the quantum dot ranges from 2 nm to 20 nm.

For example, the second display electrode 7143 may include various conductive materials. For example, the second display electrode 7143 may include a metal material such as lithium (Li), aluminum (Al), magnesium (Mg), silver (Ag), or the like.

For example, the material of the pixel definition layer 7144 may include an organic insulating material, such as polyimide, polyphthalimide, polyamide, acrylic resin, benzocyclobutene, phenolic resin, etc., or may include an inorganic insulating material, such as silicon oxide, silicon nitride, etc. The embodiments of the present disclosure are not limited in this aspect.

For example, as illustrated in FIG. 7A and FIG. 7B, the display substrate 70 further includes an encapsulation layer 7160 on the light-emitting component 7140. The encapsulation layer 7160 seals the light-emitting component 7140, so that the deterioration of the light-emitting component 7140 caused by moisture and/or oxygen in the environment can be reduced or prevented. The encapsulation layer 7160 may be a single-layer structure or a multi-layer structure, and the multi-layer structure includes a stacked structure of the inorganic layer and the organic layer. For example, the encapsulation layer 7160 may include a first inorganic encapsulation layer 7161 (that is, the first encapsulation layer 781), a first organic encapsulation layer 7162, and a second inorganic encapsulation layer 7163 (that is, the second encapsulation layer 782) arranged in sequence.

For example, the material of the encapsulation layer 7160 may include an insulating material, such as silicon nitride, silicon oxide, silicon oxynitride, polymer resin, or the like. The inorganic material, such as silicon nitride, silicon oxide, silicon oxynitride, and the like, have high density and may prevent the intrusion of water vapor, oxygen, or the like. The material of the first organic encapsulation layer 7162 may be a polymer material containing a desiccant, a polymer material that can block such as water vapor, or the like. For example, materials such as a polymer resin or the like can planarize the surface of the display region 701 of the display substrate 70 and relieve the stress of the first inorganic encapsulation layer 7161 and the second inorganic encapsulation layer 7163, and may also include a water-absorbing material such as a desiccant or the like to absorb substances such as water vapor, oxygen, and the like which penetrate into the inside of the display substrate 70.

For example, as illustrated in FIG. 7A and FIG. 7B, the pixel driving circuit 7120 may further include a first display metal layer 7127 (for example, the third conductive layer of the pixel driving circuit 7120 illustrated in FIG. 9E). The first display metal layer 7127 includes the source electrode 7125 and the drain electrode 7126 in the thin film transistor of the pixel driving circuit 7120 illustrated in FIG. 7A and FIG. 7B, and may also include an electrode in other circuits not shown or the like.

For example, as illustrated in FIG. 7A and FIG. 7B, the display substrate 70 further includes a storage capacitor 7170 (for example, the storage capacitor Cst illustrated in FIG. 8 and FIG. 9A), and the storage capacitor 7170 may include a first capacitor electrode 7171 (or example, the first capacitor electrode CE1 of the storage capacitor Cst illustrated in FIG. 8 and FIG. 9C) and a second capacitor electrode 7172 (for example, the second capacitor electrode CE2 of the storage capacitor Cst illustrated in FIG. 8 and FIG. 9D). The first capacitor electrode 7171 is disposed between the gate insulating layer 7128 and the first interlayer insulating layer 7129 (for example, located in the first conductive layer of the pixel driving circuit 7120 illustrated in FIG. 9C), and the second capacitor electrode 7172 is disposed between the first interlayer insulating layer 7129 and the second interlayer insulating layer 7131 (for example, located in the second conductive layer of the pixel driving circuit 7120 illustrated in FIG. 9D). The first capacitor electrode 7171 and the second capacitor electrode 7172 are arranged in an overlapped manner and at least partially overlap with each other in the direction perpendicular to the base substrate 710. The first capacitor electrode 7171 and the second capacitor electrode 7172 use the first interlayer insulating layer 7129 as a dielectric material to form the storage capacitor 7170.

For example, the second capacitor electrode 7172 may be provided in the same layer as the first conductive pattern 730 in the opening peripheral region 703. Therefore, the second capacitor electrode 7172 and the first conductive pattern 730 may be formed in the identical layer in the manufacturing process, for example, formed by the identical material layer through a patterning process, thereby simplifying the manufacturing process of the display substrate 70 and reducing the manufacturing cost of the display substrate 70.

For example, in some other embodiments of the present disclosure, the first capacitor electrode of the storage capacitor may be still provided in the same layer as the gate electrode, while the second capacitor electrode of the storage capacitor is provided in the same layer as the source electrode and drain electrode of the thin film transistor, so that the first capacitor electrode and the second capacitor electrode may use a stack of the first interlayer insulating layer and the second interlayer insulating layer as the dielectric material to form the storage capacitor.

For example, in some other embodiments of the present disclosure, the first capacitor electrode of the storage capacitor may be not provided in the same layer as the gate electrode, but may be located between the first interlayer insulating layer and the second interlayer insulating layer, and the second capacitor electrode of the storage capacitor may be provided in the same layer as the source electrode and drain electrode of the thin film transistor, so that the first capacitor electrode and the second capacitor electrode use the second interlayer insulating layer as the dielectric material to form the storage capacitor.

It should be noted that the cross-sectional structures in the display regions of the display substrate 20 illustrated in FIG. 2A to FIG. 2C, the display substrate 30 illustrated in FIG. 4, and the display substrate 40 illustrated in FIG. 5A and FIG. 5B may also be the same as or similar to the structure of the display region 701 of the display substrate 70 illustrated in FIG. 7A and FIG. 7B, or may also adopt other suitable structures, and the embodiments of the present disclosure are not limited in this aspect.

For example, the display substrate provided by the embodiments of the present disclosure, such as the display substrate 20, the display substrate 30, the display substrate 40, the display substrate 50, or the display substrate 70, may be an organic light-emitting diode display substrate.

For example, the display substrate provided by the embodiments of the present disclosure may also be a substrate with a display function, such as a quantum dot light-emitting diode display substrate, an electronic paper display substrate, or the like, or may also be other types of substrates, and the embodiments of the present disclosure are not limited in this aspect.

At least one embodiment of the present disclosure further provides a manufacturing method of a display substrate, and the manufacturing method includes: providing a base substrate, forming a semiconductor pattern on the base substrate, forming a first conductive pattern on the semiconductor pattern, and forming a second conductive pattern on the first conductive pattern. The display substrate includes a display region and a peripheral region surrounding the display region, the display region includes an opening, the peripheral region includes an opening peripheral region at least partially in the opening, and the semiconductor pattern, the first conductive pattern, and the second conductive pattern are in the opening peripheral region. The first conductive pattern is configured to transmit an electrical signal for the display region. The first conductive pattern includes a plurality of first wire groups arranged side by side in a first direction, and each of the first wire groups includes at least two first wires arranged side by side in the first direction. In a direction perpendicular to the base substrate, each of the at least two first wires is spaced and insulated from the semiconductor pattern and the second conductive pattern, respectively, so as to be able to form a capacitor. The semiconductor pattern is electrically connected to the second conductive pattern through a plurality of via holes in the opening peripheral region, and the plurality of via holes are between adjacent first wire groups in the first direction.

For example, in the manufacturing method of the display substrate provided by some embodiments of the present disclosure, forming the first conductive pattern on the semiconductor pattern includes: forming a first insulating layer on the semiconductor pattern, and forming the first conductive pattern on the first insulating layer. Forming the second conductive pattern on the first conductive pattern includes: forming a second insulating layer on the first conductive pattern, and forming the second conductive pattern on the second insulating layer. The plurality of via holes are located at least in the first insulating layer and the second insulating layer and penetrate at least the first insulating layer and the second insulating layer.

For example, the manufacturing method of the display substrate provided by some embodiments of the present disclosure further includes: forming a pixel driving circuit of a pixel unit on the base substrate in the display region. The pixel driving circuit includes a thin film transistor and a storage capacitor, the thin film transistor includes a gate electrode, an active layer, a source electrode, and a drain electrode, and the storage capacitor includes a first capacitor electrode and a second capacitor electrode opposite to the first capacitor electrode. The semiconductor pattern and the active layer are in an identical layer, the second conductive pattern, the source electrode, and the drain electrode are in an identical layer, and the first conductive pattern and at least one of a group consisting of the second capacitor electrode, the gate electrode, and the first capacitor electrode are in an identical layer.

For example, the display substrate provided by the embodiments of the present disclosure, such as the above display substrate 20, the display substrate 30, the display substrate 40, the display substrate 50, or the display substrate 70, may be manufactured by the manufacturing method of the display substrate provided by the embodiments of the present disclosure.

The technical effects of the manufacturing method of the display substrate provided by the embodiments of the present disclosure may refer to the technical effects of the display substrate provided by the above embodiments of the present disclosure, and details are not described herein again.

At least one embodiment of the present disclosure further provides a display device. The display device includes the display substrate according to any one of the embodiments of the present disclosure, and for example, includes the display substrate 20, the display substrate 30, the display substrate 40, the display substrate 50, or the display substrate 70 described above.

The structure, function, and technical effect of the display device provided by the embodiments of the present disclosure may refer to the corresponding descriptions of the display substrate provided by the above embodiments of the present disclosure, and details are not described herein again.

For example, the display device provided by the embodiments of the present disclosure may be an organic light-emitting diode display device. Alternatively, the display device provided by the embodiments of the present disclosure may also be a device with a display function, such as a quantum dot light-emitting diode display device, an electronic paper display device, etc., or may also be other types of devices, and the embodiments of the present disclosure are not limited in this aspect.

For example, the display device provided by the embodiments of the present disclosure may be any product or component with the display function, such as a display substrate, a display panel, an electronic paper, a mobile phone, a tablet computer, a television, a display, a notebook computer, a digital photo frame, a navigator, etc., and the embodiments of the present disclosure are not limited in this aspect.

The following statements should be noted:

(1) The accompanying drawings of the embodiments of the present disclosure involve only the structure(s) in connection with the embodiment(s) of the present disclosure, and other structure(s) can be referred to common design(s).

(2) For the purpose of clarity, in the accompanying drawings for illustrating the embodiment(s) of the present disclosure, the thickness of a layer or a region may be enlarged or narrowed, that is, the drawings are not drawn in a real scale. It should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. Any modifications or substitutions that easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising a display region, a peripheral region surrounding the display region, and an opening,
    wherein the opening is on a side of the peripheral region away from the display region, and the peripheral region comprises an opening peripheral region at least partially surrounding the opening;
    the display substrate comprises a base substrate, a semiconductor pattern, a first conductive pattern, and a second conductive pattern, the semiconductor pattern, the first conductive pattern, and the second conductive pattern being in the opening peripheral region;
    the semiconductor pattern is on the base substrate, the first conductive pattern is on a side of the semiconductor pattern away from the base substrate, and the second conductive pattern is on a side of the first conductive pattern away from the semiconductor pattern;
    the first conductive pattern is configured to transmit an electrical signal for the display region;
    the first conductive pattern comprises a plurality of first wire groups arranged side by side in a first direction, and each of the first wire groups comprises at least two first wires arranged side by side in the first direction;
    in a direction perpendicular to the base substrate, each of the at least two first wires is spaced and insulated from the semiconductor pattern and the second conductive pattern, respectively, so as to be able to form a capacitor;
    the semiconductor pattern is electrically connected to the second conductive pattern through a plurality of via holes in the opening peripheral region, and the plurality of via holes are between adjacent first wire groups in the first direction; and
    the display substrate further comprises a pixel driving circuit, and an orthographic projection of the pixel driving circuit on the base substrate does not overlap with the opening peripheral region.

2. The display substrate according to claim 1, wherein among the plurality of first wire groups, regions, where via holes are arranged in a substantially identical manner, are between adjacent first wire groups in the first direction.

3. The display substrate according to claim 1, wherein a distance between adjacent first wire groups in the first direction is greater than a distance between adjacent first wires in the each of the first wire groups in the first direction.

4. The display substrate according to claim 3, wherein among the plurality of first wire groups, the distance between adjacent first wire groups in the first direction is approximately identical.

5. The display substrate according to claim 3, wherein among the plurality of first wire groups, the at least two first wires in the each of the first wire groups are arranged in an identical manner in the first direction.

6. The display substrate according to claim 5, wherein in the each of the first wire groups, the distance between adjacent first wires in the first direction is approximately identical.

7. The display substrate according to claim 1, wherein via holes on both sides of one first wire group in the first direction are arranged in a substantially symmetrical manner with respect to the one first wire group along an extending direction of the first wires.

8. The display substrate according to claim 1, wherein at least one row of via holes arranged in an extending direction of the first wires is provided between adjacent first wire groups in the first direction.

9. The display substrate according to claim 1, wherein the semiconductor pattern comprises a plurality of conductive blocks arranged side by side in a second direction, and the plurality of conductive blocks are electrically connected to the second conductive pattern through the plurality of via holes, respectively,
    the second direction being different from the first direction.

10. The display substrate according to claim 9, wherein widths of the plurality of conductive blocks in the second direction are approximately identical, and a distance between adjacent conductive blocks in the second direction is approximately identical.

11. The display substrate according to claim 1, wherein the second conductive pattern is continuously provided in the opening peripheral region.

12. The display substrate according to claim 1, further comprising a first insulating layer and a second insulating layer,
    wherein the first insulating layer and the second insulating layer are at least in the opening peripheral region;
    the first insulating layer is on a side of the semiconductor pattern away from the base substrate, the first conductive pattern is on a side of the first insulating layer away from the semiconductor pattern, the second insulating layer is on a side of the first conductive pattern away from the first insulating layer, and the second conductive pattern is on a side of the second insulating layer away from the first conductive pattern; and
    the plurality of via holes are at least in the first insulating layer and the second insulating layer and penetrate at least the first insulating layer and the second insulating layer.

13. The display substrate according to claim 1, wherein the display region comprises a first display region and a second display region, which are on opposite sides of the opening, the first display region, the opening, and the second display region are sequentially arranged in an extending direction of the first wires, and the first wires sequentially extend through the first display region, the opening peripheral region, and the second display region, so as to transmit an electrical signal for the first display region and the second display region.

14. The display substrate according to claim 13, wherein the display region further comprises a third display region;

the third display region is connected to one of two opposite edges of the first display region in the first direction, and is connected to one of two opposite edges of the second display region in the first direction;

the display substrate comprises a plurality of third wires in the third display region, an extending direction of the plurality of third wires is identical to the extending direction of the first wires, and the plurality of third wires are configured to transmit an electrical signal for the third display region; and the plurality of third wires and the first conductive pattern are in an identical layer.

15. The display substrate according to claim 1, further comprising a power wire pattern, wherein the power wire pattern and the second conductive pattern are in an identical layer, or the power wire pattern is on a side of the second conductive pattern away from the base substrate, and the power wire pattern is electrically connected to the second conductive pattern to provide an electrical signal.

16. The display substrate according to claim 1, further comprising a plurality of pixel units in the display region, wherein each of the pixel units comprises the pixel driving circuit on the base substrate, and the pixel driving circuit comprises a thin film transistor and a storage capacitor;

the thin film transistor comprises a gate electrode, an active layer, a source electrode, and a drain electrode, and the storage capacitor comprises a first capacitor electrode and a second capacitor electrode opposite to the first capacitor electrode;

the semiconductor pattern and the active layer are in an identical layer, the second conductive pattern, the source electrode, and the drain electrode are in an identical layer, and the first conductive pattern and at least one of a group consisting of the second capacitor electrode, the gate electrode, and the first capacitor electrode are in an identical layer; and the first wires in the plurality of first wire groups of the first conductive pattern are configured to transmit scanning signals for pixel driving circuits of the pixel units, respectively.

17. The display substrate according to claim 1, wherein the first conductive pattern further comprises at least one fourth wire, and in the direction perpendicular to the base substrate, the fourth wire is spaced and insulated from at least one of a group consisting of the semiconductor pattern and the second conductive pattern, so as to be able to form a capacitor.

18. The display substrate according to claim 1, wherein the opening peripheral region comprises a first dam region, a second dam region, and an interval region, the first dam region at least partially surrounds the display region, the interval region at least partially surrounds the first dam region, and the second dam region at least partially surrounds the interval region; and an orthographic projection of the semiconductor pattern, the first conductive pattern, the second conductive pattern, and the plurality of via holes on the base substrate comprises a portion not overlapped with the first dam region.

19. The display substrate according to claim 1, wherein an orthographic projection of the first wire group on the base substrate has an overlapping region with an orthographic projection of the semiconductor pattern on the base substrate and an orthographic projection of the second conductive pattern on the base substrate.

20. A manufacturing method of a display substrate, comprising:

providing a base substrate, forming a semiconductor pattern on the base substrate, forming a first conductive pattern on the semiconductor pattern, and forming a second conductive pattern on the first conductive pattern, wherein the display substrate comprises a display region, a peripheral region surrounding the display region, and an opening;

the opening is on a side of the peripheral region away from the display region, and the peripheral region comprises an opening peripheral region at least partially surrounding the opening;

the semiconductor pattern, the first conductive pattern, and the second conductive pattern are in the opening peripheral region;

the first conductive pattern is configured to transmit an electrical signal for the display region;

the first conductive pattern comprises a plurality of first wire groups arranged side by side in a first direction, and each of the first wire groups comprises at least two first wires arranged side by side in the first direction;

in a direction perpendicular to the base substrate, each of the at least two first wires is spaced and insulated from the semiconductor pattern and the second conductive pattern, respectively, so as to be able to form a capacitor;

the semiconductor pattern is electrically connected to the second conductive pattern through a plurality of via holes in the opening peripheral region, and the plurality of via holes are between adjacent first wire groups in the first direction; and the display substrate further comprises a pixel driving circuit, and an orthographic projection of the pixel driving circuit on the base substrate does not overlap with the opening peripheral region.

* * * * *